(12) United States Patent
Otto

(10) Patent No.: US 9,793,032 B2
(45) Date of Patent: Oct. 17, 2017

(54) REINFORCED 2212 MULTIFILAMENT SUPERCONDUCTING WIRE WITH LOW ASPECT SHAPE, CABLES THEREOF, AND 2223 SILVER TAPE-BASED CABLES

(71) Applicant: Alexander Otto, Groton, MA (US)

(72) Inventor: Alexander Otto, Groton, MA (US)

( * ) Notice: Subject to any disclaimer, the term of this patent is extended or adjusted under 35 U.S.C. 154(b) by 0 days.

(21) Appl. No.: 15/043,145

(22) Filed: Feb. 12, 2016

(65) Prior Publication Data

US 2016/0260527 A1 Sep. 8, 2016

Related U.S. Application Data

(60) Provisional application No. 62/116,169, filed on Feb. 13, 2015.

(51) Int. Cl.

| | |
|---|---|
| *H01B 12/10* | (2006.01) |
| *H01L 39/14* | (2006.01) |
| *H01L 39/24* | (2006.01) |
| *H01B 1/02* | (2006.01) |
| *H01B 3/30* | (2006.01) |
| *H01B 7/22* | (2006.01) |
| *H01B 12/06* | (2006.01) |
| *H01B 13/00* | (2006.01) |

(52) U.S. Cl.
CPC ............ *H01B 12/10* (2013.01); *H01B 1/023* (2013.01); *H01B 3/30* (2013.01); *H01B 7/223* (2013.01); *H01B 12/06* (2013.01); *H01B 13/0016* (2013.01); *H01L 39/143* (2013.01); *H01L 39/248* (2013.01)

(58) Field of Classification Search
USPC ...................................... 174/125.1
See application file for complete search history.

(56) References Cited

U.S. PATENT DOCUMENTS

| | | | | |
|---|---|---|---|---|
| 6,397,454 B1 * | 6/2002 | Seuntjens | ............. | H01L 39/143 174/125.1 |
| 2014/0296077 A1 * | 10/2014 | Shen | ...................... | H01B 12/08 505/231 |

FOREIGN PATENT DOCUMENTS

DE  EP0554681 A1  8/1993

OTHER PUBLICATIONS

International Search Report and Written Opinion of the International Searching Authority, PCT/US2016/017842, Sep. 15, 2016, International Searching Authority.

* cited by examiner

*Primary Examiner* — William H Mayo, III
*Assistant Examiner* — Krystal Robinson
(74) *Attorney, Agent, or Firm* — Porter Wright Morris & Arthur

(57) ABSTRACT

Methods and devices for producing reinforced 2212 multifilament superconducting wire with low aspect shape. More specifically, methods and devices for producing reinforced round or rectangular wire with reinforcement strips. Methods and devices for producing cable using the reinforced 2212 multifilament superconducting wire as well as for producing reinforced 2223 Silver tape-based cable.

21 Claims, 24 Drawing Sheets

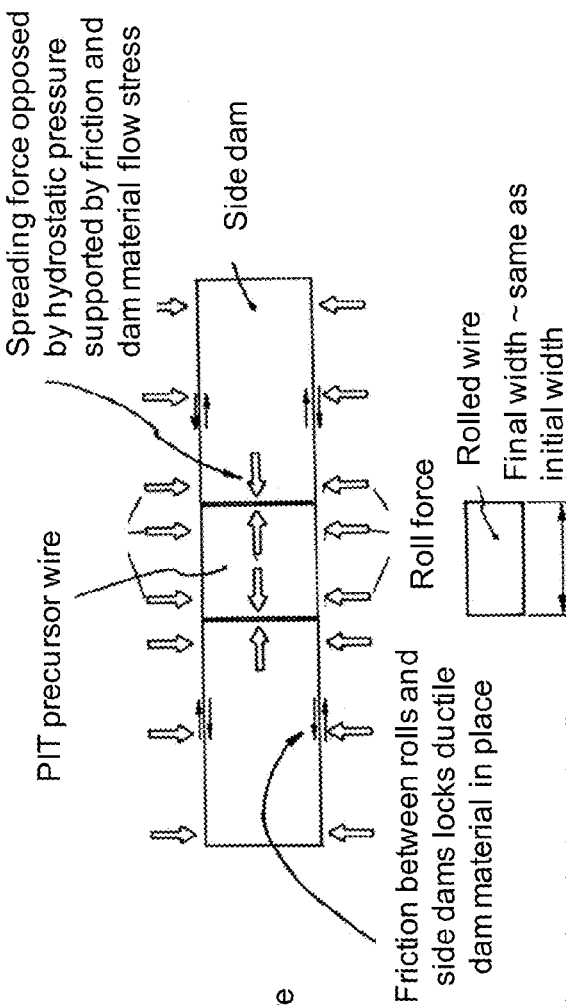
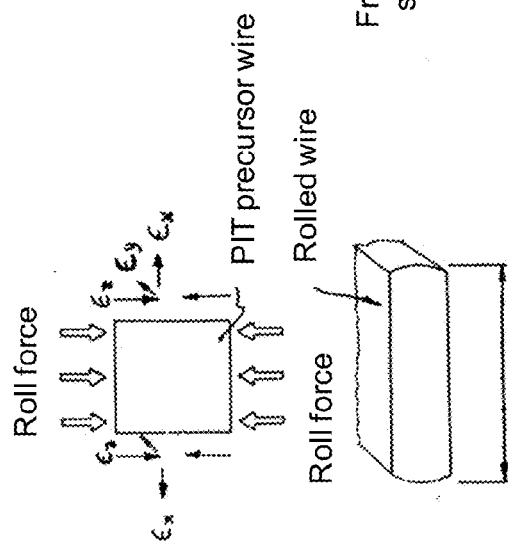
FIG. 3

Short Length Test Method 2): Compressive Force With Constraint On Lateral Spreading Compression blocks
Spring platen
High temperature spring
Superalloy strip
2212/Ag rectangular wire
Porous ceramic limits lateral spread
Retaining block

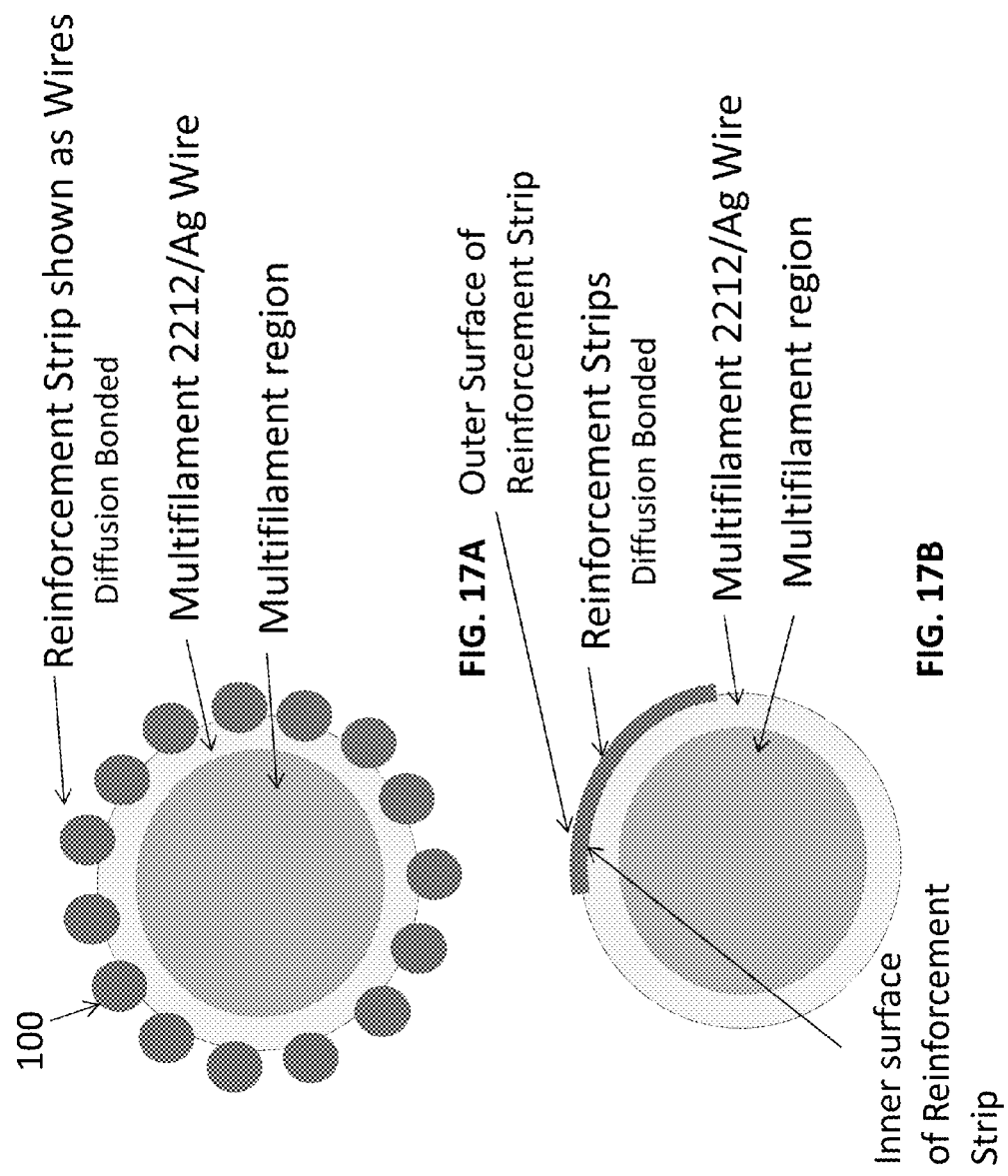

REINFORCED 2212 MULTIFILAMENT SUPERCONDUCTING WIRE WITH LOW ASPECT SHAPE, CABLES THEREOF, AND 2223 SILVER TAPE-BASED CABLES

CROSS-REFERENCE TO RELATED APPLICATIONS

This application claims the benefit of provisional application 62/116,169, filed Feb. 13, 2015, the entire contents of which are hereby incorporated by reference.

TECHNICAL FIELD

This application relates generally to methods and devices for producing reinforced 2212 multifilament superconducting wire with low aspect shape. More specifically, it relates to methods and devices for producing reinforced cable using the 2212-silver multifilament superconducting rectangular wire as well as for producing reinforced 2223 Silver tape-based cable.

BACKGROUND

High temperature superconducting (HTS) oxide based wires provide the opportunity for ground breaking advances in the field levels and performance of large accelerator magnets, while greatly reducing their weight, size and power consumption. This is made possible by their extraordinarily high upper critical fields, flux pinning, transition temperatures, and retained critical current density in wire (Je) out to today's measurable limit of 44 T, enabling field generation up to and beyond 44 T, with orders-of-magnitude lower electric power consumption.

There is a specific demand for HTS conductors for use in next generation accelerator magnets that can operate with high winding current and current density in magnetic fields above 20 Tesla (T), with mechanical properties that support large Lorentz force induced stresses and with acceptably low losses in ramped fields. As yet there is no HTS based conductor produced that meets all these requirements even though such a conductor is also in demand for many other applications, including fusion reactor magnets, lightweight, high powered generators and transformers as well as very high field research and NMR magnets. Methods and devices outlined herein meet the long-felt need of HTS with superior properties.

SUMMARY

Embodiments described herein provide for a reinforced 2212 multifilament round wire comprising: the 2122 multifilament superconducting round wire; at least one reinforcement strip comprising a metal core comprising on an outer surface of the metal core at least one of aluminum oxide, nickel oxide, and chromium oxide; and the at least one reinforcement strip is coupled to the outside of the 2212 multifilament round wire.

Additional embodiments described herein provide for a reinforced 2212 multifilament rectangular wire comprising: the 2122 multifilament superconducting rectangular wire; at least one reinforcement strip comprising a metal core comprising on an outer surface of the metal core at least one of aluminum oxide, nickel oxide, and chromium oxide; and the at least one reinforcement strip is coupled to the outside of the 2212 multifilament rectangular wire.

Additional embodiments described herein provide for a cable comprising reinforced 2212 multifilament superconducting rectangular wire comprising: at least four of the 2212 multifilament superconducting rectangular wires; at least one reinforcement strip comprising a metal core comprising on an outer surface of the metal core at least one of aluminum oxide, nickel oxide, and chromium oxide; and the at least one reinforcement strip is coupled to the outside of one of the 2212 multifilament superconducting rectangular wires.

Yet additional embodiments herein provide for a reinforced 2223 silver tape-based cable comprising: two or more 2223 silver tape stacks comprising at least two tapes in each tape stack; at least one reinforcement strip coupled, respectively, to each of the at least two tapes; the at least one reinforcement strip comprising a metal core comprising on an outer surface of the metal core at least one of aluminum oxide, nickel oxide, and chromium oxide; and opposing edge guides; each edge guide coupled to an edge of at least one of the two tape stacks; and a conduit housing the 2223 silver tape-based cable.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

FIG. 3 illustrates sheet rolling and hydrostatic pressure rolling, including hydrostatic pressure (HP) rolling stresses and strains applied to a round wire as it is rolled into substantially a square shape, and then substantially a rectangular shape;

FIG. 16 C illustrates another single-sided reinforcement embodiments as described herein;

FIG. 17A illustrates a reinforced embodiment as described herein;

FIG. 17 B illustrates a reinforced embodiment via reinforcement strips as described herein;

DETAILED DESCRIPTION

Figure 1:
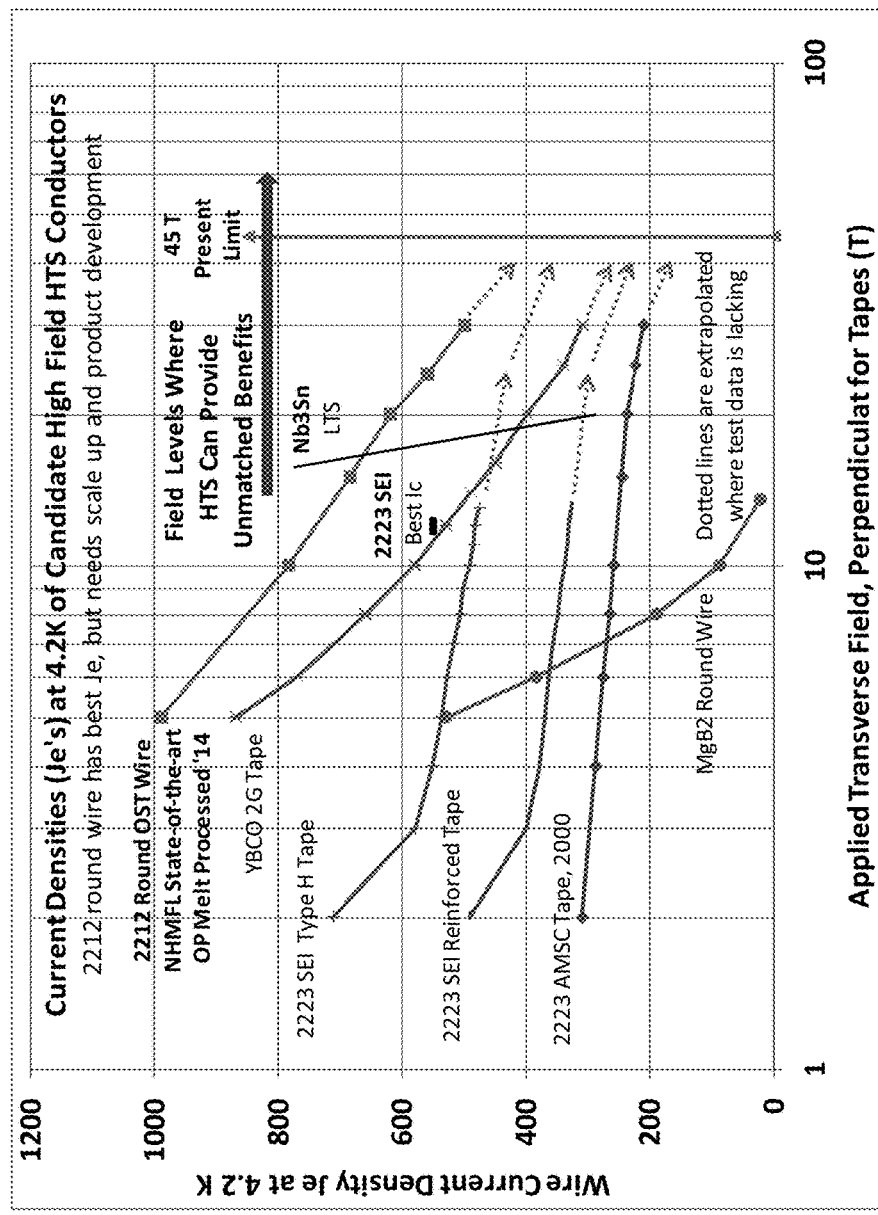
FIG. 1. Illustrates a graph of wire current density versus applied transverse field, demonstrating the current density superiority of 2122 in a round wire form.

Specific embodiments of the present disclosure will now be described. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which embodiments of this invention belong. The terminology used herein is for describing particular embodiments only and is not intended to be limiting of the invention. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about," which is intended to mean up to ±10% of an indicated value. Additionally, the disclosure of any ranges in the specification and claims are to be understood as including the range itself and also anything subsumed therein, as well as endpoints. Unless otherwise indicated, the numerical properties set forth in the specification and claims are approximations that may vary depending on the desired properties sought to be obtained in embodiments of the present invention. Notwithstanding that numerical ranges and parameters setting forth the broad scope of embodiments of the invention are approximations, the numerical values set forth in the specific examples are reported as precisely as possible. Any numerical values, however, inherently contain certain errors necessarily resulting from error found in their respective measurements.

Parts of methods described herein such as mathematical determinations, calculations, inputting of data for computations or determinations of equations or parts thereof can be performed on parts of or one or more computers or computer systems that can include one or more processors, as well as software to run or execute programs and run calculations or computations.

Methods and systems and parts thereof described herein can be combined so as to implement embodiments of the invention. Forms of words used herein can have variations: for example when a word such as "calculate" is used, this implies that variations such as "calculated" and "calculating" are understood and have been considered.

Part 1 Strengthened High Current Rectangular 2212 Wire that is Fully Reacted, Cabled and Wound into a High Field Magnet Coil 8.1 Identification and Significance of the Problem or Opportunity As indicated above, there is a specific demand for HTS conductors for use in next generation accelerator magnets. 2212 round or rectangular wire can provide superior Je in higher operating temperatures and magnetic fields while in principle enabling cable architectures and low loss features that are proven to work with low temperature superconductors (LTS). However in order to meet this demand, 2212 wires and cables must be developed 1) with sufficiently improved stress and bend tolerance to allow react and wind fabrication of large coils, 2) with uniform, high current densities in reliably produced long lengths 3) with lower loss architectures for use in ramped field conditions, and 4) with acceptably low cost and high output to provide the end user with a net benefit.

One underlying concept of embodiments outlined herein involves providing 2212-based superconducting wire with a better shape than current round wire for increased winding current density, with a strengthened form that enables react-and-wind large coil manufacturing plus tolerance of much larger Lorentz forces and smaller coil winding bend diameters, with a high current density attained by a lower cost method than the current state of the art, and in high current fully transposed cable in conduit forms.

8.1.1 2212 as Compared to Other HTS Options

Each conductor embodiment under development presents challenges and opportunities for meeting the requirements of the many applications that would benefit from suitably developed HTS conductors.

(1) Wide, thin "2G" tape with 123 ((Re)Ba$_2$Cu$_3$O$_7$) monofilament film produced by about 10 companies.

(2) Wide, thin "1G" tape with rolled, solid state reaction textured and sintered 2223 (Bi$_2$Sr$_2$Ca$_2$Cu$_3$O$_x$) merged filaments in a silver matrix made by Powder in Tube (PIT) by Sumitomo Electric Industries and Innost.

(3) Round/rectangular wire with sintered MgB$_2$ filaments made by PIT primarily by Columbus Superconductors and HyperTech.

(4) Round/rectangular wire with melt textured 2212 (Bi$_2$Sr$_2$Ca$_1$Cu$_2$O$_y$) filaments in a silver matrix made by PIT mainly by Oxford Superconductor Technology (OST), but also SupraMagnetics and Supercon.

Wide and thin HTS tapes are poorly suited for solenoid coils, ramped field conditions, and some types of large magnets. For these, round or rectangular multifilament 2212, MgB$_2$ and Nb$_3$Sn wires provide options for solutions beyond the cabling and field ramp loss limitations of tapes. Recent advances at the Applied Superconductivity Center (ASC) of the National High Magnetic Field Laboratory (NHMFL) on OPmelt texturing have also demonstrated that 2212 wire can provide the best Je among all superconductors at high fields, as displayed by the data graphed in FIG. 1. Among round wire candidates, MgB$_2$ like Nb$_3$Sn also loses its ability to carry current at the high fields and temperatures possible with 2212, making it unsuitable for higher field, higher operating temperature applications, despite the lower cost of its constituents.

FIG. 1. Wire Je's at 4.2 K of candidate superconductors for high field and low loss use, illustrate the Je superiority of 2212 in a round wire form that is well suited for use in high field magnets.

Reaching the world leading high field Je levels displayed in FIG. 1 with 2212 has increased interest in 2212 wire development, products and applications. Technology and wire features for producing long lengths of wire by low cost, high yield methods, and with the wire in a strengthened form to allow react and wind cabling followed by coil winding now need to be developed.

Properties of the 2212 wire targeted for development and addressing these challenges are compared to state of the art 2212 wire in TABLE 1, illustrating the multi faceted benefits of the proposed concept.

| Feature | Current state of the art | Proposed approach |
| --- | --- | --- |
| 2212/Ag cross-section area | 0.5 to 1.5 mm$^2$ | 0.3 to 1.5 mm$^2$ |
| Scalable | Yes | Yes |
| Melt texture approach for high Jc | Gas Over Pressure (OP) | 1 atm or lower pressure OP with pre-rolling and in situ mechanical compression |
| Cost of long length melt texturing | high | low |
| Wire shape | round | rectangular/square/round |
| Stress tolerance | Below 150 MP | Above 300 MPa |
| Axial tensile stress tolerance | <0.4% | Greater than 0.4% |
| Bend tolerance minimum diameter | ~25 cm | <20 cm |
| React and wind (R&W) option | Not for most applications | Yes for most applications Except for coils with less than about 15 cm wind diameter |
| Shape filling in cables and coils | ~70% | 80% to 95% |
| Wire overlap contact force tolerance | Low due to small cross-over contact areas | High due to large cross-over contact areas |
| Reinforcement applications | None | Thin oxide coated metal strips, sintered on before or in final melt texturing heat heat treatment |
| Reinforcement material | None | Aluminum oxide, Nickel oxide, Chromium oxide or Cobalt oxide scale forming high temperature oxidation resistant alloys, containing Al, Fe, Cr, Co or Ni—examples Haynes 214, Hastalloy, Fe—Cr—Al Kanthal brand alloys |
| Reinforced wire dimensions | NA | Rectangular width: 0.4 to 2 mm, Round 0.4 to 2 mm diameter |

Table 1, above, shows a comparison of state of the art 2212 wire to wire and cable based on the concepts described here.

2212 Wire Process, Architecture and Materials Concept

Figure 2:
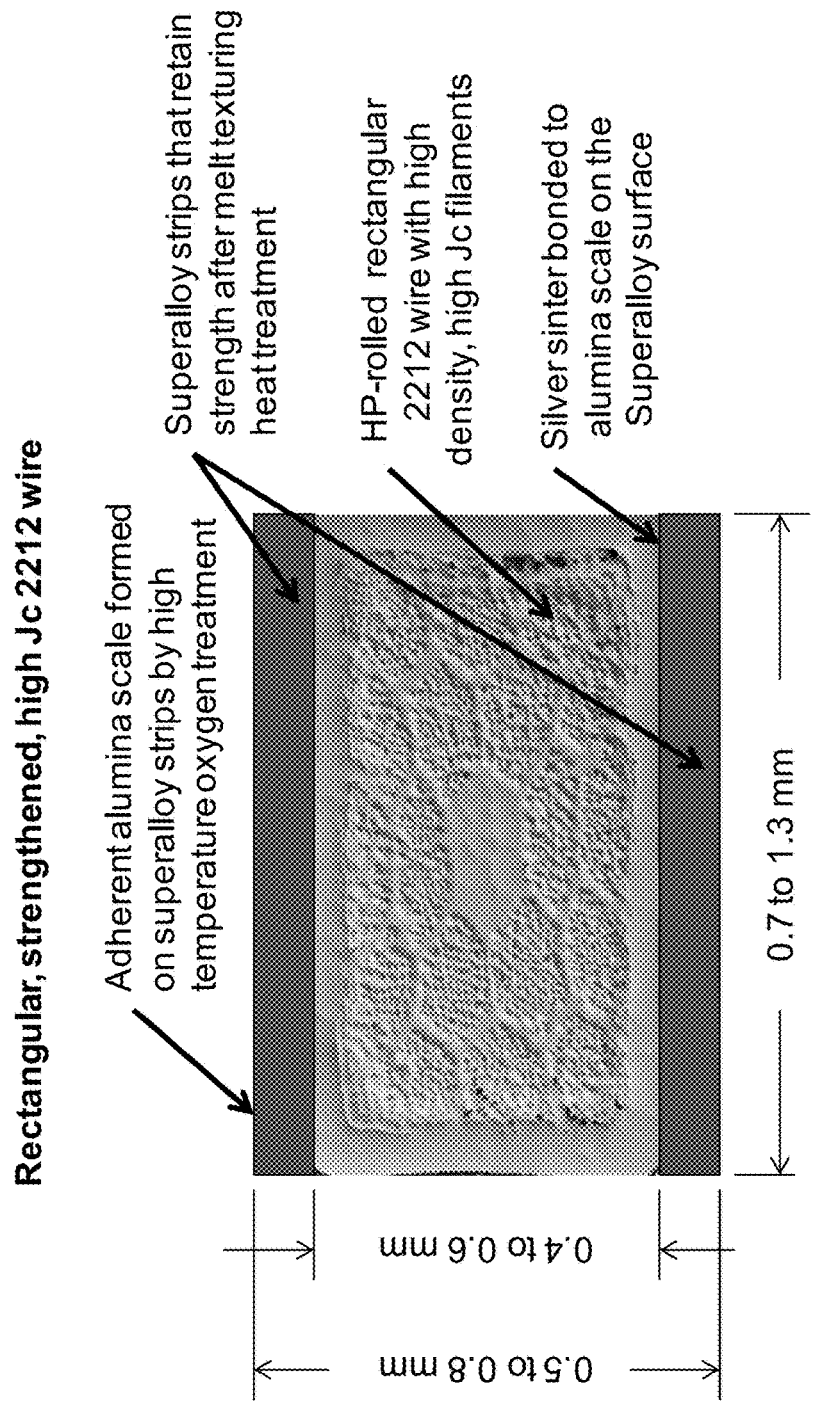
FIG. 2 illustrates a photomicrograph demonstrating the microstructure of a strengthened, rectangular, high current density 2212 wire as described herein.

A non-limiting embodiment of the 2212 wire proposed for development is illustrated in FIG. 2.

FIG. 2 Illustration of strengthened, rectangular high Je 2212 wire that is a target of non-limiting embodiments provided herein.

Example Process:

Standard as drawn wire, for example about 1 mm in diameter, can be hydrostatic-pressure (HP) rolled into a rectangular, homogeneous shape by novel methods provided herein. Our experimental assessment of the applicability of this method to 2212 is described in a later section. The wire shape can have an approximately 2.5:1 aspect and its thickness and width can be about 0.5 mm by 1.2 mm (in specific embodiments the thickness can be from about 0.3 to about 0.8 mm and the width from about 0.4 to about 1.6 mm). HP rolling can increase the density of the powder prior to melt texturing to above 90 percent.

The rolled wire can be and/or then be co-wound onto a heat resistant mandrel with alumina scale forming superalloy strips of about 0.02 to about 0.15 mm in thickness and about the same width as the wire on either side of the wire, configured as shown in FIG. 2. In specific embodiments the strips are of about 0.05 to about 0.2 mm. in thickness. Large back tensions in the strips during winding and very low tension in the 2212 wire place the 2212 wire into a compressive hoop stress. The CTE of the silver in the 2212/Ag wire can also be up to about 1.5× the CTE of the superalloy strips.

This CTE mismatch will further add to the compressive mechanical stress that will be applied to the wire by the strips in the high temperature melt texturing heat treatment. In this way the gas pressure required by OP to attain high Jc will be greatly diminished, if it will be required at all.

During the melt texturing, while high Jc 2212 forms in the filaments, the well-adhered protective alumina scale on the strip surfaces can sinter to the reactive metallic surface of the silver, forming a fully bonded composite comprised of two high strength strips with the 2212/Ag wire in the middle. The oxygen exchange with the atmosphere can still occur through the exposed sides of 2212/Ag wire.

During part or the full duration of the heat treatment, the ODS (Oxide dispersion strengthened) silver may also undergo some creep from the compressive forces applied by the strip until the force is relieved by lateral creep induced motion of the silver. However the strip compression can increase the density of the filaments after the melt (in specific embodiments immediately after the melt) because the liquid, with porosity coalesced into bubbles, do not support any load until the liquid is fully dense. The target dense filament structure can therefore be formed after melting (in specific embodiments immediately after melting). Upon completion of the melt texturing heat treatment, the now 3-ply wire will be unwound or slid off axially from the heat treat mandrel.

Problems Addressed by Specific Approaches Proposed Herein—

The HP-rolled rectangular wire with co-wound superalloy strip combination provides a solution to five challenges with 2212 wire production and properties (1) Compression that mimics the gas OP approach for high Jc but at lower cost and with less complexity (2) Strengthening of the 2212/Ag wire so it can be used in lower cost, and more practical react and wind coil fabrication modes, and also so it can be used in higher field and more mechanically demanding applications (3) Tolerance of much smaller diameter bending because the 2212/Ag in the rectangular wire will be about half as thick the diameter of round wire with a similar cross-sectional area.

(4) Improved tolerance of cross over contact forces because of the much larger flat contact surfaces with rectangular wire as compared to round wire (5) Long length melt texturing heat treatment without the need for expensive to apply and remove parting agents that are required to prevent silver surface adhesion to the mandrel with 2212/Ag.

HP-Rolling of PIT 2212 and 2223 Wires

Wire drawing, with its combination of tensile axial and radial compressive forces on the wire, has proven to be best suited for producing long length fine filament 2212 and 2223 precursor wires. This success is primarily due to the low, nominally 70 percent of theoretical, metastable equilibrium powder pack density that each filament converges onto after it is drawn through the first few of many dies. Although this low density powder state enables the formation of relatively uniformly shaped, and very fine filaments, its density must be increased to be as close to 100 percent of theoretical as possible for high Jc and uniform mechanical properties in the final sintered filament product.

Sheet rolling of round PIT precursor wires into tapes by cylindrical rolls has been used extensively to increase the densities of as drawn powder particle filaments by crushing the particles (in specific embodiments crushing the particles into the voids) as well as rearranging their positions in the rolling plane. This step, in its highly developed form today, increases powder density to within 90 percent of its theoretical limit, and it also aligns the plate shaped superconducting precursor phase grains with their high Jc directions along the wire axis.

However, sheet rolling allows for lateral spreading of the wire, thereby making very thin and very wide tape. In this mode, localized, shear stress based inhomogeneous deformation also occurs in parallel with and orthogonal to the wire axis, leading to so called "sausaging" and other variability in filament cross section area, shape uniformity and properties.

In the case of 2212 wire, it is highly useful to establish a similar process to sheet rolling in order to increase 2212 powder density in each filament, but without changing the wire's shape into a high aspect form. With the coil applications targeted by 2212, the 2212 conductor's round shape can be changed to be square or rectangular in order to partially or fully fill (or more fully fill) the coil volume and thereby provide up to 25 percent higher operating current densities as well as to greatly reduce the contact pressure and likelihood of indent damage.

Two methods that can be used for bar and wire rolling are so called "groove" and 'Turk's head" rolling. Unfortunately for the case of fine filament precursor wire structures, these methods introduce large, localized redundant work strains in specific cross sections of the wire, often resulting in filament structure damaged that occurs while the powder density is increased.

I have completed extensive investigations into this problem with work aimed at developing low loss, low aspect shaped 2223 wire that had its density increased by a rolling method that matched the density of powder in sheet rolled tape, but without the localized shear strains that can occur with sheet rolled tape.

Specifically, an HP rolling method illustrated in FIG. 3 has been invented that converts a round PIT wire to a square or rectangular shape without shear damage to the filaments, while increasing its density as if it were sheet rolled. In this method, a form of hydrostatic pressure is applied onto the two sides of the wire, once it rearranges into the square or rectangular shape early in the deformation zone, while standard cylindrical rolls provide the top and bottom surface deformation and pull the work-piece through the mill.

FIG. 3 provides an illustration of the HP rolling stresses and strains applied to round wire as it is rolled into a square, and then rectangular shape (in specific embodiments approximately a square shape)

HP Rolling Capability Assessment with 2212 Round Wire

Figure 4:
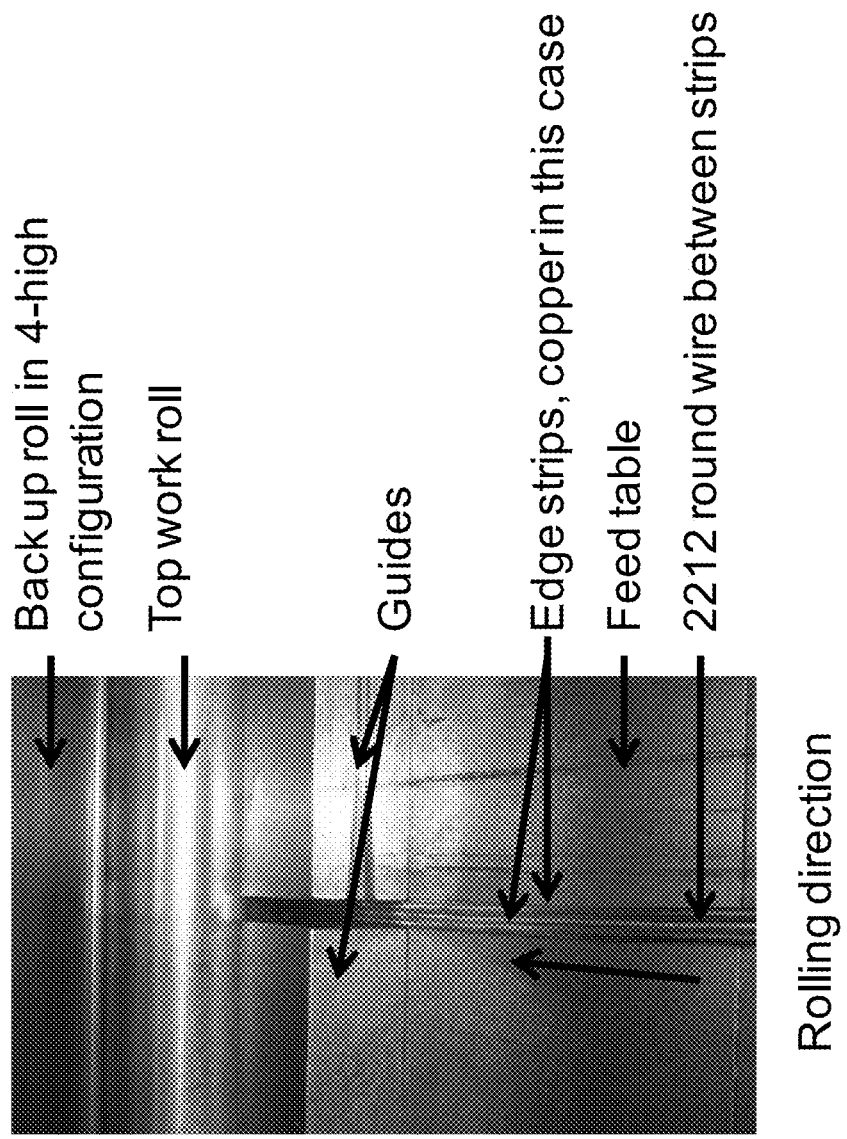
FIG. 4 illustrates a photograph of a test bed used in an assessment of the HP rolling of round 2212 wire to a substantially rectangular shape.

In versions of embodiments provided herein of HP rolling, the round 2212 wire can be co-fed into the rolling mill with highly ductile metal side strips that flow and expand in around the 2212 wire as it is deformed into the square cross-sectioned shape as shown in the photo of FIG. 4. Further reduction in area as the wire passes into and through the roll bite can occur with the compression of the wire from the rolls and with side compression from the hydrostatic pressure of strips that in combination produce high compressive pressure throughout the wire cross section.

FIG. 4 illustrates a photograph of the test bed used in a first assessment of the HP rolling of round 2212 wire to a rectangular shape (Mill at ASC NHMFL, Photo by A. Otto). Edge strips may be comprised of any ductile metal, with embodiments comprising, in part or in full, copper, aluminum, steel and their alloys.

HP Rolling Study

Approximately 50 cm samples of 0.8 mm diameter and 1.2 mm diameter standard 2212 as drawn precursor wires produced by OST were rolled with the Stannat mill at the ASC/NHMFL using side strips of various dimensions and materials. The sample dimensions were measured before and after each rolling condition. In specific embodiments the measurements are about 0.6 to about 1.6 mm diameter. Some samples were processed through 1 atmosphere melt texturing, followed by Ic testing. SEM images of 2 wire's cross sections in FIG. 5 illustrate that the method can be used to form low aspect rectangular wire shapes and internal structures that are free from large scale shear displacement common with other low aspect rolling methods.

Figure 5:
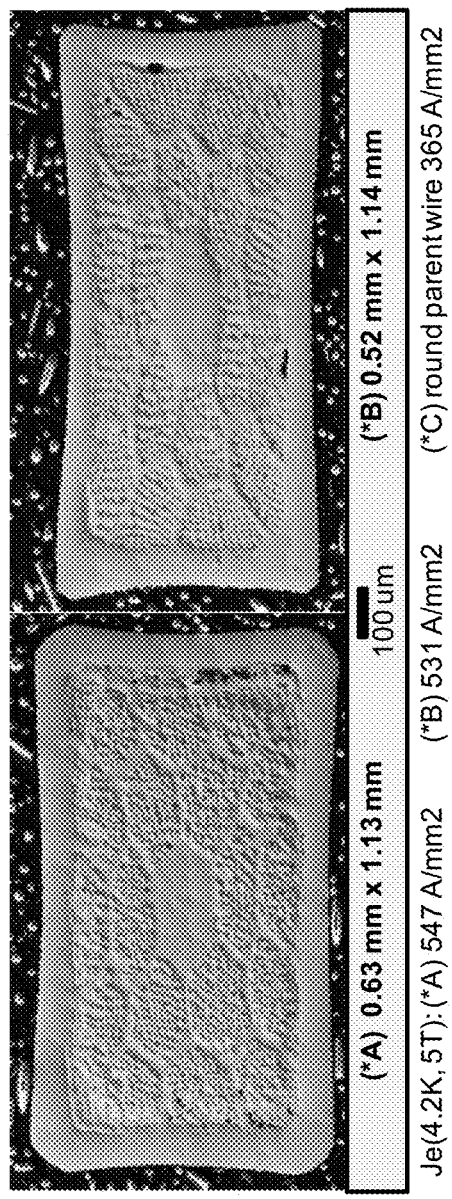
FIG. 5 illustrates SEM images of wire cross sections following processing through 1 atmosphere followed by Ic (critical current: the electrical current level where a greater-than-zero resistance is first found to occur in a superconductor and where-after with additional current increase electrical resistance is found to increase very rapidly) testing to form low aspect rectangular wire shapes and internal structures that are free from large scale shear displacement common with other low aspect rolling methods.

FIG. 5 illustrates SEM photographs of HP rolled and 1 atm melt textured 2212 rectangular wire samples illustrating the high filament density obtained even without OP processing, and the 50 percent higher wire current densities as compared to the parent round wire (In specific embodiments it is at least 50 percent higher).

FIG. 5 Illustration of the high density filament structure and rectangular shape that was attained in first tests with this approach, without any rolling process or melt texture parameter development at all.

The data in FIG. 5 demonstrates about a 50 percent improvement in the first samples as compared to the round wire samples that were not rolled but otherwise were given the same melt texturing heat treatments. The melt texturing heat treatment used had previously been optimized for the round wire, not the HP rolled wire, and still the HP rolled wire came out much better.

Anticipated Public Benefits

Applications likely to benefit from rectangular and round shaped, strengthened and, lower cost 2212 wire and its cabled form, as well as 2223 tape based transposed cables includes 1) large accelerator-related magnets that may be used in CERN's upgrades 2) advanced >1 GHz NMR systems 3) Practical cost and sized research magnets for studies in the 25-44 T range, 4) Instrument magnets beyond 44 T that open up understanding in materials, physics and imaging. 5) Higher operating temperature, higher field magnets for fusion development, and 6) Lower weight, higher powered, more efficient wind generators and transformers for reduced emissions of green house gases.

Required quantities of cables are likely to increase rapidly over the next three to five years as cables with compelling properties are integrated into large scale prototype development programs, and subsequently into superior commercial high field magnets and their applications.

Technical Features: 2212

(1) Increased filament powder density from the as drawn density at about 70 percent of theoretical to greater than 90 percent of theoretical by hydrostatic-pressure rolling of round wire into nominally 1:1 to 3:1 aspect shaped rectangular wire.

(2) Rectangular wire melt textured with large surfaces contacting superalloy strips like Haynes 214 or Fe—Cr—Al alloys, such that its Je matches or exceeds the Je of wire reacted without superalloy strips (3) Compression applied to the wire sandwiched between the two reinforcement strips during melt texturing by wrapping long wire with the strips on each side of the wire, and with the strips having a larger back tension and/or a smaller coefficient of thermal expansion than the Bi2212/Ag wire, thereby applying the compressive force onto the 2212/Ag wire.

(4) Application of a salt or similar compound containing sodium or potassium, preferably water soluble, to the surfaces of 2212/Ag wires to prevent them from sintering to any other metal or ceramic surface they may contact during melt texturing. The same kind of material may also be applied between a 2212/Ag wire's surface and an adjacent metal or ceramic surface to exert opposing force to expansion or outward movement of the wire surface during melt texturing or any other heat treatment as shown in FIG. 6.

(5) Higher filament density and Je in wires with compression was applied by the superalloy strip on the large surfaces than without compression from the strips.

(6) Je>500 A/mm$^2$ at 4.2K, 5 T or greater in rectangular wire made by HP rolling.

(7) A factor of two increase in axial stress tolerance from strips that occupy less than 50 percent of the wires cross-section area, and greater than 300 MPa absolute stress tolerance—the stress where critical current, Ic, starts to degrade.

(8) Bend diameter tolerance of 8 cm or smaller with 2212 wire of the same cross sectional area as ~0.8 mm diameter wire and a shape aspect of less than 3:1.

(9) React and wind transposed cable comprised of 6 or more rectangular, strengthened 2212 wires without Ic degradation in cabling and Je above 500 A/mm$^2$ at 4.2K, 5 T field and these properties: (a) Bend tolerance to 15 cm diameter or less; (b) Total cable cross-sectional area of less than 300 mm2; (c) Axial stress tolerance to >400 MPa of the cable without Ic degradation; (d) Fully strengthened cable critical current density—where the superconductor starts to become resistive of above 40 A/mm2 at 4.2K, in magnetic field to 45 T or greater; (e) Operation of these cables at currents or above 3 kA at fields greater than 20 T, as wound into coils with diameters of 15 cm to 100 cm, and without Ic degradation from the Lorentz force induced axial forces.

Non-Limiting Objective 1: Increased filament density to >80% by HP-rolling

HP-rolling is setup, commissioned and applied to standard as drawn purchased 2212 round wire. Controlled feed fixtures are constructed and tested. The standard sheet rolling mill is used initially to complete experiments in which 1 mm to 1.2 mm diameter round wire will be HP-rolled to different thickness and widths in the 1:1 to 3:1 shape aspect range. The densities of the powder cores are measured by using accurate dimension measurements and weighing supplemented by a standard pycnometer method and found to be increased from below 75 percent to above 80 percent. The filament structures of the samples by cross-sectional and longitudinal metallography are found to be uniform and dense.

Non-Limiting Objective 2: HP-rolled wire melt textured to standard Je levels while contacting superalloy strips HP-rolled samples are produced by the method described in non-limiting Objective 1. These are pre-diffusion bond heat treated and melt textured with the superalloy strips in contact with the wire large surfaces, so that they adhere by sintering to those surfaces and the Ic of the wire matches the Ic of wire similarly melt textured without the contacting strips. In some cases it is found that pre-oxidation required for the superalloy strips is required for the best results, where pre-oxidation comprises heating the strips to >800 C in oxygen. Samples are tested for Ic at 4.2 K and at temperatures up to 66 K., and it is found that the wires with and without the contacting strips exhibit critical currents with about 25% of each other. The adhesion strengths of the strips are found to exceed 10 MPa tensile.

Non-Limiting Objective 3: Increased final filament density and Je by compression of the strips onto the wire surfaces.

Two methods of applying a controlled amount of surface compression through the strips are tested: 1) a short length method in which a fixture with high temperature (ceramic) springs applies a very well controlled and constant amount of compression through a pair of platens to the strip—wire—strip stack as depicted in FIG. 6 during melt texturing and 2) a longer length method in which a multiple turns of the strip—wire—strip stack are wound onto a 5 to 25 cm diameter mandrel with large tensions in the strips, followed by melt texturing heat treatment. Additional overwrap of high strength high temperature alloy strips is used in some cases to further increase wire Ic and filament density.

Figure 6A:
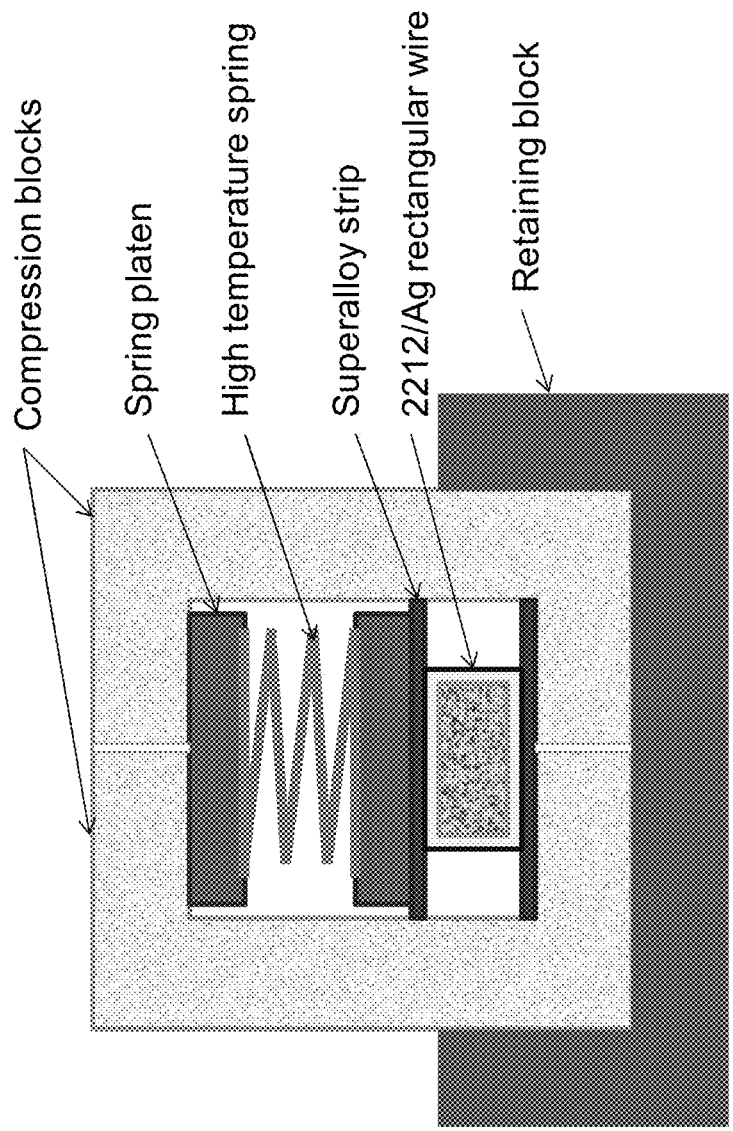
FIG. 6A illustrates a short length method to determine the current density and dimensional changes in wire versus compressive mechanical load with no constraint to lateral spread.
Figure 6B:
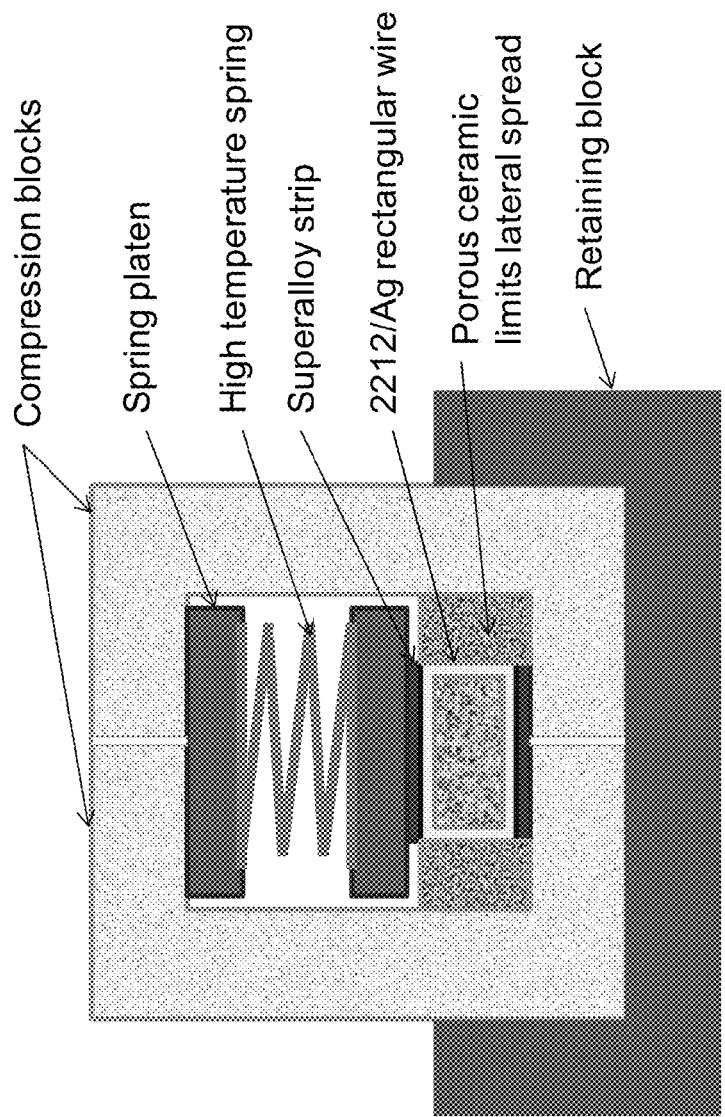
FIG. 6B illustrates a short length method to determine the critical current density (Je: the critical current density in the wire or, Jc: the critical current density in the superconducting material portion of composite wires) and dimensional changes in wire versus compressive mechanical load with constraint to lateral spread with a porous salt or ceramic, lateral spread limiting material for a compressive pressure range that spans the OP (gas over pressure) melt texturing where Jc improvements have been demonstrated.

A first set of parametric studies are completed by method 1 using a high precision tube furnace and wire and strip sample types selections based on the results in the above examples. Samples are melt-textured at increasing compression levels without any side constraining material as shown in FIG. 6 allowing lateral spread from the applied compressive force, which will be adjusted by a combination of using high temperature springs with different constants and compressed lengths using platens with different thicknesses. All components in the fixtures depicted in FIGS. 6A and 6B will be made with high temperature tolerant superalloys and ceramics.

The dimensions of the melt textured samples are measured and their Ic's determined at 4.2K in 5 T. The average density of the 2212 filaments in each sample is determined using a combination of dimension, weights and pycnometry, and found to be in excess of 80%. The critical current densities of the 2212/Ag part of these wires exceeds 500 A/mm2, and in some cases, 800 A/mm2.

FIG. 6 Illustrations of the short length method used to determine the Jc, density and dimensional changes in wire versus compressive mechanical load with no constraint to lateral spread (A) and (B), with a porous salt or ceramic, lateral spread limiting material (B), for a compressive pressure range that spans the OP melt texturing where Jc improvements have been demonstrated.

Long Length Tests

Figure 7:
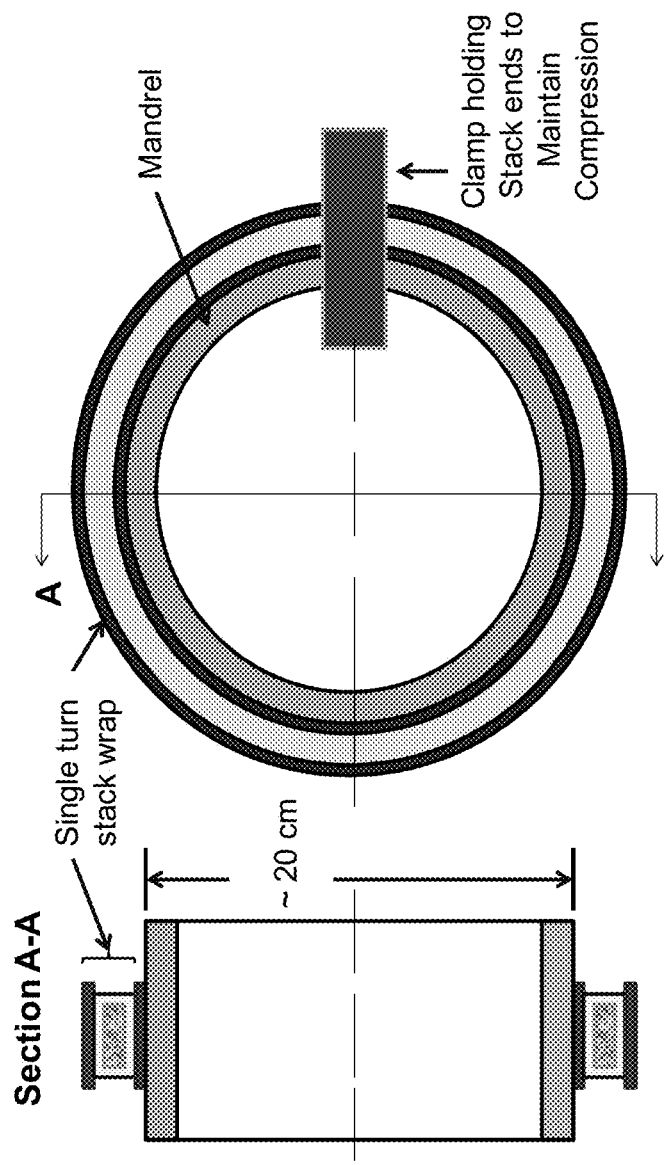
FIG. 7 illustrates a long length test method to produce single and multiple turn lengths of tape stacks with different tensions in the strips, applying long length melt texturing by the compression strip approach.

The set up depicted in FIG. 7 is used to produce single and multiple turn lengths of tape stacks with different tensions in the strips, applying long length melt texturing by the compression strip approach. Nominally >60 cm samples are produced, and up to 2000 m at increasing levels of back-tension and their Ic's, dimensions, densities and internal structures determined. The filament densities in fully reacted wire are above 80% and the wire critical current densities are above 500 A/mm2 and in some cases above 800 A/mm2 at 4 K self field.

Figure 8:
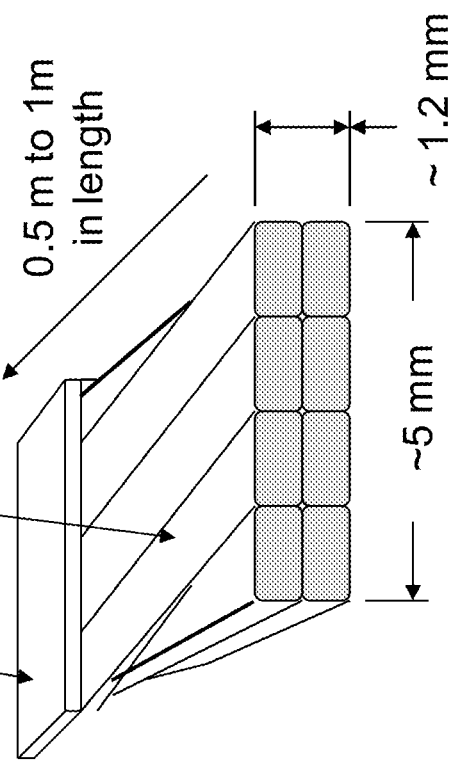
FIG. 8 illustrates a transposed cable sample resulting from a planetary cabling setup using wire samples produced by a mandrel wrapped sample melt texturing method.

FIG. 8 Illustration of the set up used to develop the high strength strip method for developing compressive loads on 2212 rectangular wire in long length melt texturing heat treatments and while also sinter-attaching the same strip as a strengthening member for the wire during that heat treatment.

Non-Limiting Objective 4: A doubling of stress tolerance from strips that occupy less than 50 percent of the wire cross-sections Samples produced are tested for their axial tensile stress and strain tolerance. Initially axial stress and strain are applied to samples at ambient temperature with Ic testing before and after to determine retention and the onset of degradation conditions. Some samples are tested in tension at cryogenic temperatures with in situ testing of Ic at increasing stress and strain levels. Stress at which Ic starts to decrease irreversibly is found to exceed 300 MPa, and the corresponding strain to exceed 0.3 percent. As with earlier tasks, the internal structures of select wires will be determined.

Non-Limiting Objective: Bend diameter tolerance to below 25 cm with rectangular wire.

Strengthened, rectangular wires such as those of embodiments provided herein and tested above are tested for bend tolerance in both directions, as measured by ambient bending to progressively smaller diameters, with an Ic test in between each bend. The bend diameter where Ic starts to degrade is below 25 cm in at least one direction, and as low as 10 cm.

Non-Limiting Objective: React and wind, about 1 m long transposed cabling feasibility with 6 or more wires.

Our design model for HTS tapes and wires is employed to design cabling pitch and cross-section architectures that does not damage the wires. Using the mandrel wrapped sample melt texturing method, wire samples of 1 m length or greater are produced, with Ic and dimensions tested. These are then applied to construct a cable as shown in FIG. 8, using a planetary cabling set up. The cable samples are tested for Ic at 4.2K in 5 T, and the results compared to individual wire Ic's. The cable Ic is found to be within 80 percent of the sum of the Ic's f individual wires. Cables are constructed with 6-strip-strengthened wire or more, and with critical current levels at 4.2K in 20 T field to 45 T field of 3 kA, 5 kA and 10 kA or greater, when coiled to a diameter of 40 cm or less, as small as 30 cm or less and transporting these currents in up to 45 T.

Conduits comprised of a high strength alloy, of embodiments such as Fe—Cr—Al alloys or any number of metals with a modulus above 190 GPa are used to jacket the cables. For example a cable with a 3 kA Ic(4.2K, 17 T to 45 T) has a conduit or similar additional reinforcement of 10 to 40 mm2 added while a 5 kA Ic cable has 20 to 100 mm2 of added material, and cable with up to 10 kA has up to 220 mm2 of added material.

Figure 9:
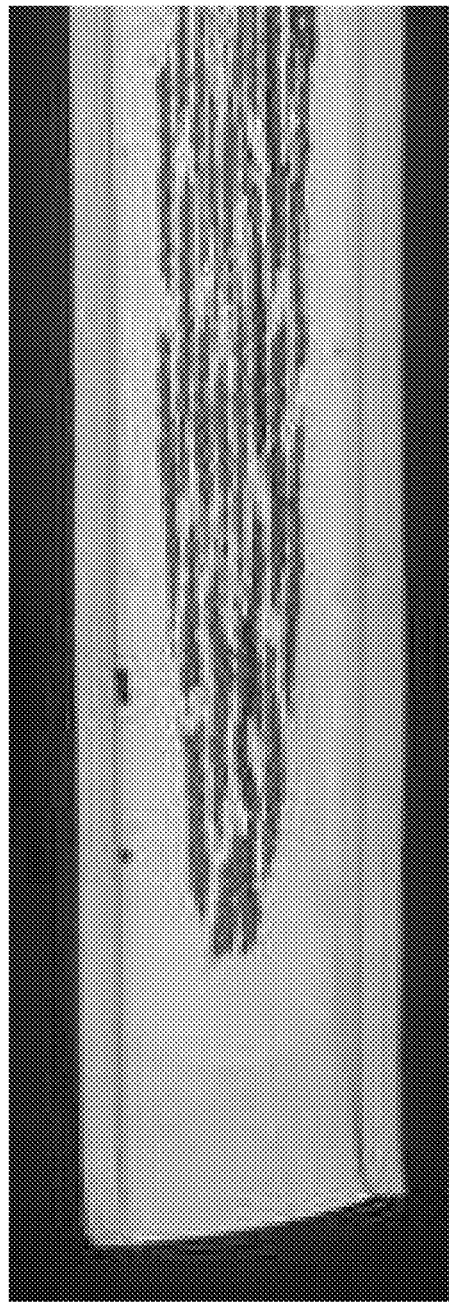
FIG. 9 illustrates a cross-section of a multifilament 2223 tape that is lamination reinforced with two very thin, high yield stress, high modulus metal strips, and that almost doubles the axial tensile load tolerance of the tape compared to tape similarly reinforced with stainless strips.

FIG. 9. Illustration of an 8 wire 2212 transposed cables made with the wire samples produced showing react and wind cabling feasibility. See also the cable in conduit design for the 2223 case. The same cable in conduit applies here also. Cables with two wires through their thicknesses, and from 2 to up to 40 wires across their widths are covered by this design.

Part 2: 2223 Tape Based Transposed Cable

In Field Current Density of 2223 Tape

Although both 2212 wire and 2 G tape exhibits superior lower field Je, the shallowest in field Je decline in field of 2223, makes it a competitive candidate above about 20 T. The Je of 2223/Ag tape before reinforcement is added converges onto the Je of 2212/Ag at about 30 T, and both are superior to 2G above about 15 T. However 2212/Ag, like 2223/Ag, also can have and/or require reinforcement because silver's mechanical properties, namely its low modulus and annealed state after it is subjected to HTS forming heat treatments do not allow the required axial stress tolerance. This will be accomplished by applying and sintering (diffusion bonding) the high strength strips that can withstand the subsequently melt texturing heat treatment to the 2212 wires as described. The effective Je of 2212 in its robust form will then be very similar to the Je of 2223/Ag at high field levels.

Availability in Long Lengths

The most commercially developed HTS products presently are 2223-based tapes. Both SEI and AMSC developed and commercialized 2223/Ag/strengthened products, which required overcoming very challenging scale up, long length manufacturing, yield and product issues. 2G tape conductor technology and products are presently in the midst of this challenging phase of scaling up throughput, establishing reliable long piece length output, eliminating local defects and long range property variations, developing products and quality assurance systems for consistently meeting requirements and taking cost out. As was also the case with 2223, the duration of this phase for 2G is impossible to predict with much certainty.

Availability in Very High Axial Stress Tolerant Form

Recently, SEI introduced a very high stress tolerant 2223 tape that is lamination reinforced with thin strips of a very high yield stress, high modulus alloy. A cross-section of this tape is shown in FIG. 9.

FIG. 9 Cross-section of recently developed multifilament 2223 tape that is lamination reinforced with two very thin, high yield stress, high modulus metal strips, and that almost doubles the axial tensile load tolerance of the tape compared to tape similarly reinforced with stainless strips.

This tape is now available commercially with only a minor increase in price as compared to standard stainless steel reinforced tape. The properties of the reinforcement strips and reinforced 2223 tape in TABLE 2 illustrate the trade-off between the large gain in tensile stress tolerance and Je decrease.

| Reinforcement Strip (Ambient Temperature) | New Strip - an Example Embodiment as Described Herein | Stainless Steel Strip |
|---|---|---|
| Young's Modulus (Gpa) | 221 | 182 |
| Proportional limit stress (MPa) | 2000 | 400-600 |
| Proportional limit strain (%) | 0.9 | 0.25-0.3 |
| CTE (ppm/K/m) | 13 | 16 |
| 2223 Reinforced Tape | | |
| Tensile load tolerance at 77 K (MPa) | 540 | 320 |
| Je at 4.2 K in 30 T field (A/mm2) | 290 | 290 |
| Ic at 4.2 K in 30 T field (A) | 400 | 400 |
| Unreinforced 2223 Tape | | |
| Tensile load tolerance at 77 K (MPa) | 120 | — |
| Je at 4.2 K in 30 T field (A/mm2) | 420 | — |

Figure 10:
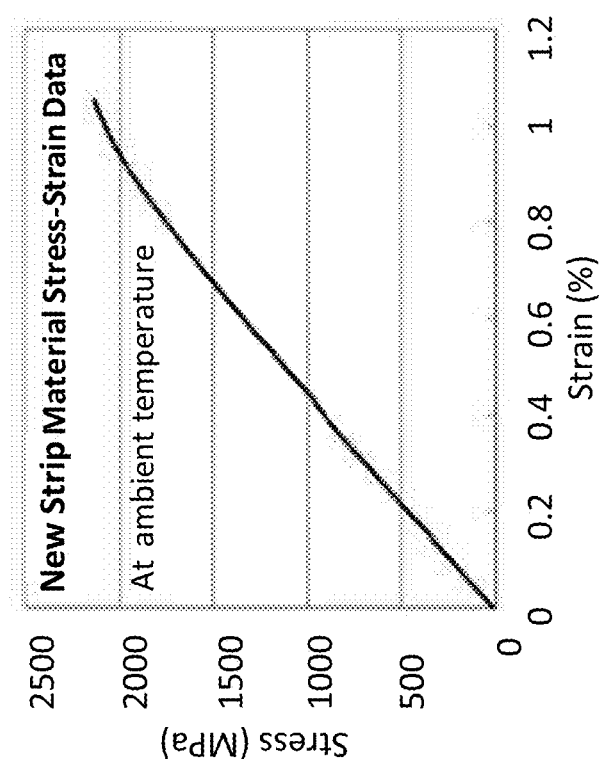
FIG. 10 illustrates a graphing of stress strain at ambient temperature of an embodiment of a strip as provided herein.

TABLE 2 illustrates the properties of unreinforced and reinforced 2223 tape, and reinforcement strips, showing the stress tolerance benefits traded off against the decrease in wire Je due to the added strip area. FIG. 10 illustrates a graphing of stress strain at ambient temperature of the new strip. Developing the capability to use this high modulus, high yield stress material enabled close to factors of two improvements as compared to stainless steel, which is already very robust. Embodiments provided herein, in cabled high current form, provide for tapes that are much better suited for operating without degradation in high fields where Lorentz forces exert large axial tensile stresses.

Beyond a certain operating current (Iop), field level and wind diameter however, even these cables will need to be placed in a conduit or other load supporting components

8.1.4 Transposed Cables

Figure 11A:
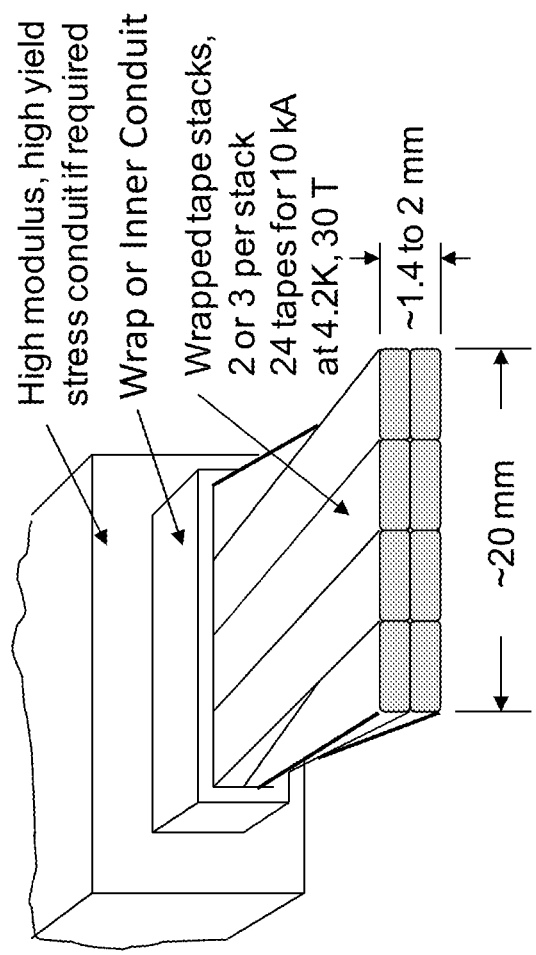
FIG. 11(A) illustrates a schematic of the proposed 2223 based transposed cable as described herein.

In one type of transposed cable, each strand follows a helical path around the cable axis such that every strand occupies the position of every other strand in each the cable pitch length. This length is the distance over which the strand returns to the same position on the cable cross-section. A schematic of the proposed 2223 based transposed cable is shown in FIG. 11(A) and of a 3 kA cable assembly in FIG. 11(B). In our 2223 cable design, each strand will be comprised of 2 or 3 2223 tapes that are stacked together, with a total of about 24 tapes to attain a cable critical current of 10 kA in 30 T at 4.2K, based on the in-field Je data for 2223 in FIG. 1.

FIG. 11 Illustrations of (A) proposed 10 kA transposed cable concept using high strength 2223 tape in stacks (B) a 5 kA test bed cable design for developing cabling, cable architecture and properties. FIG. 11A illustrates a wrap or inner conduit that can be applied to the surface of the cabled structure, in order to define its geometry better and hold it together better, so it can be more easily and tightly placed within the conduit. This wrap or inner conduit can also at times be made of a porous, perforated or otherwise permeable material, to allow a gaseous coolant like He, H2 or Ne, or a liquid coolant like liquid He or liquid Neon, for example, to flow through.

This transposed architecture can lead to lower stack to stack coupling losses in ramped magnetic fields because inductive loops between stacks are limited to pitch length. Transposed cables have been used in many types of high current superconducting magnet windings. However in order to attain low losses in rapidly ramped fields, the stacks in the cable also exhibit low loss, and can have axially twisted fine filaments within each stack and adequate resistance between filaments to inhibit filament to filament current flow that is driven by inductively induced voltages.

In the case of the proposed 2223 cable however, the 2223-filaments in each tape are fully coupled and the filament bundle in each tape is almost as wide as the 4.5 mm wide tape. As a result, these tapes are not low loss in fast field ramp conditions. The cable proposed here is not yet intended for use in fast field ramp conditions at this point because low loss 2223 tape, or any low loss HTS, have not yet been developed. The product goal of this program is a low cost, long length 2223 cable that can transport very large currents in high magnetic fields such that its properties do not degrade from the large Lorentz forces and tight bending of the cable at the innermost turns in high field coils.

Figure 11B:
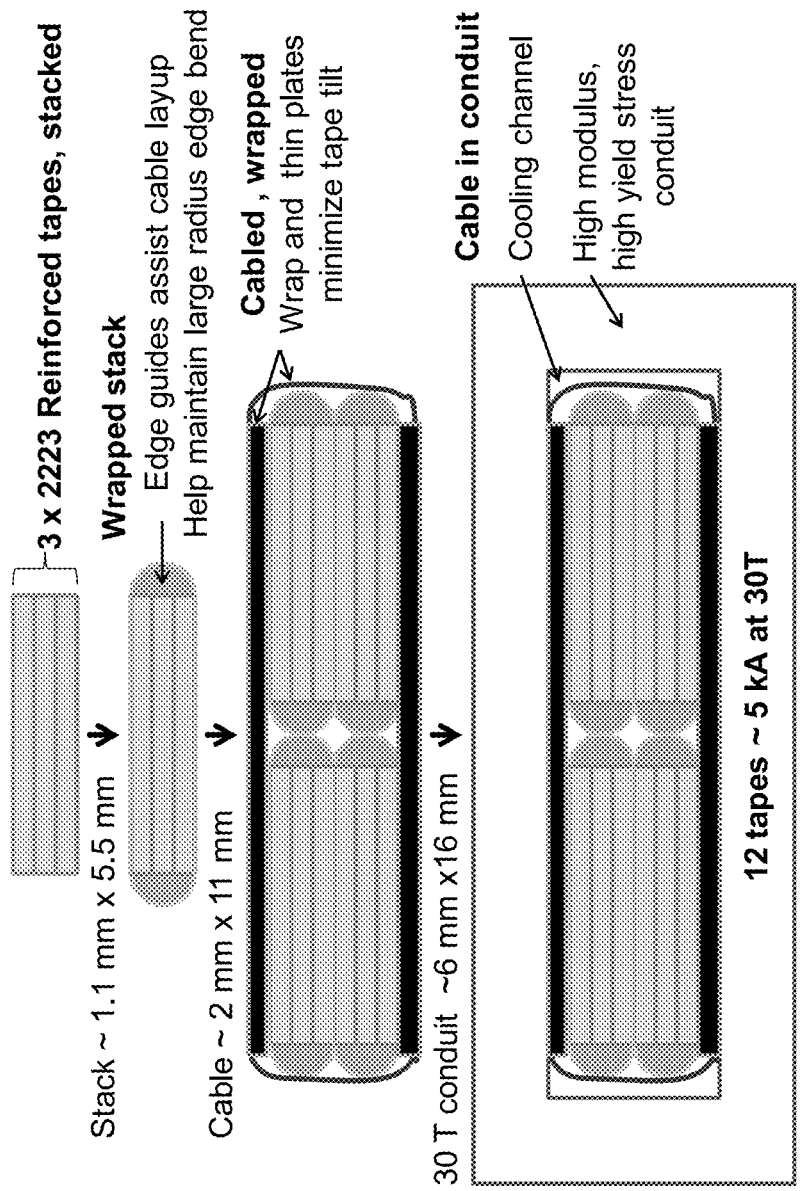
FIG. 11(B) illustrates a 3 kA cable assembly as described herein.
Figure 13:
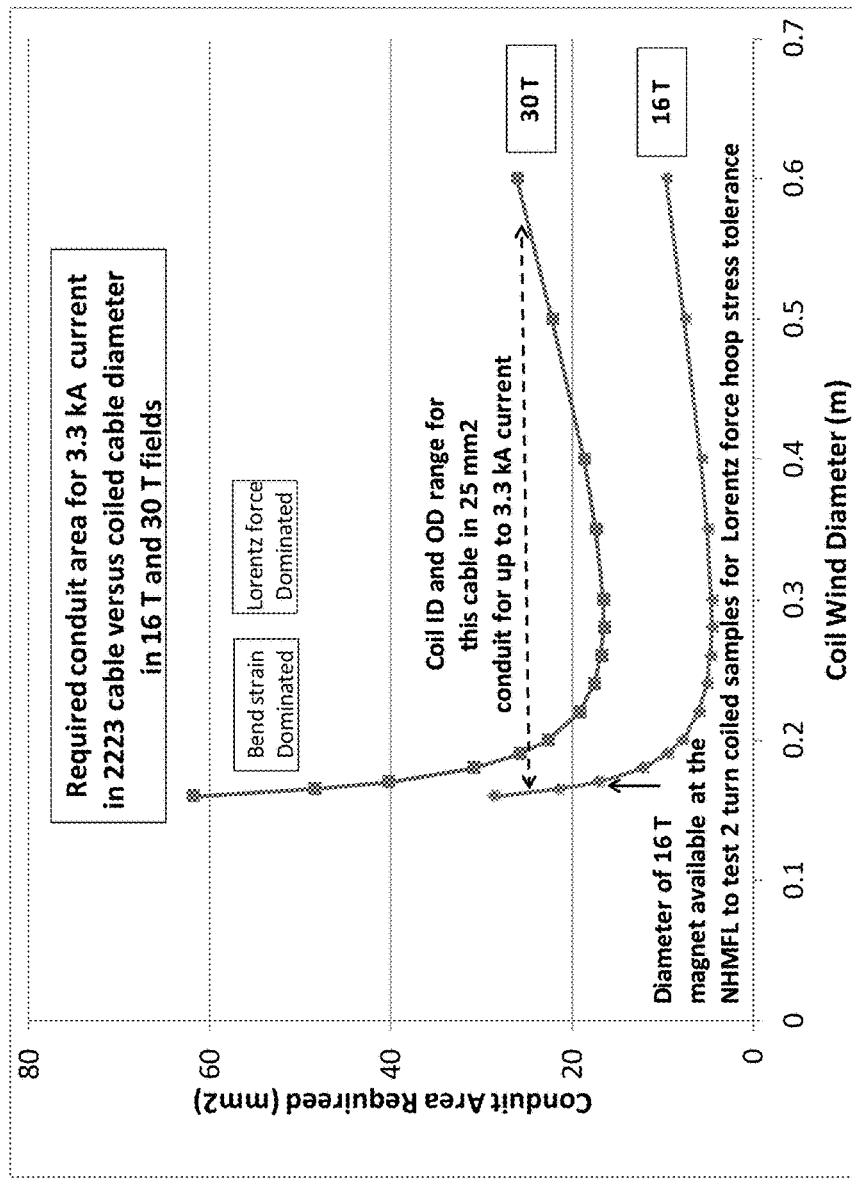
FIG. 13 illustrates an estimated conduit area needed for 2223 to remain below its critical strain at increasing coil turn diameters from the lower bend tolerance limit into the Lorentz force dominated regime for an 8 tape model cable.

Resolving the Challenges of Making High Current Transposed Cables with 2223 Tapes: A) Edge Bending the Wide, Thin Tape Producing these 2223-tape based cable designs requires that each tape stack be bent in its top plane to get it up and down in the cable and in its edge plane to get it back and forth across the width of the cable in each pitch length as shown in FIG. 13. In general, the difficulty of edge bending a tape increases as its shape aspect ratio increases. In order to help with this problem, tightly wrapped tape stacks will be used as shown in FIG. 11(B), reducing the effective shape aspect of the cabled strand, while allowing more tapes and higher cable Ic's in a narrower configuration. However increasing cable thickness reduces its bend tolerance and requires more of the available strain budget for the 2223 ceramic.

During cabling, the edge bend radius and strain of every part of each tape must remain above the minimum radius where degradation starts to occur in filaments nearest to the tape edges as they reach the critical strain of the 2223 oxide. Furthermore, as shown in FIG. 13(B), edge bending of high aspect shapes can lead to tilting of the tape or tape bundles up or down from the cable plane, disrupting cable geometry.

Figure 12A:
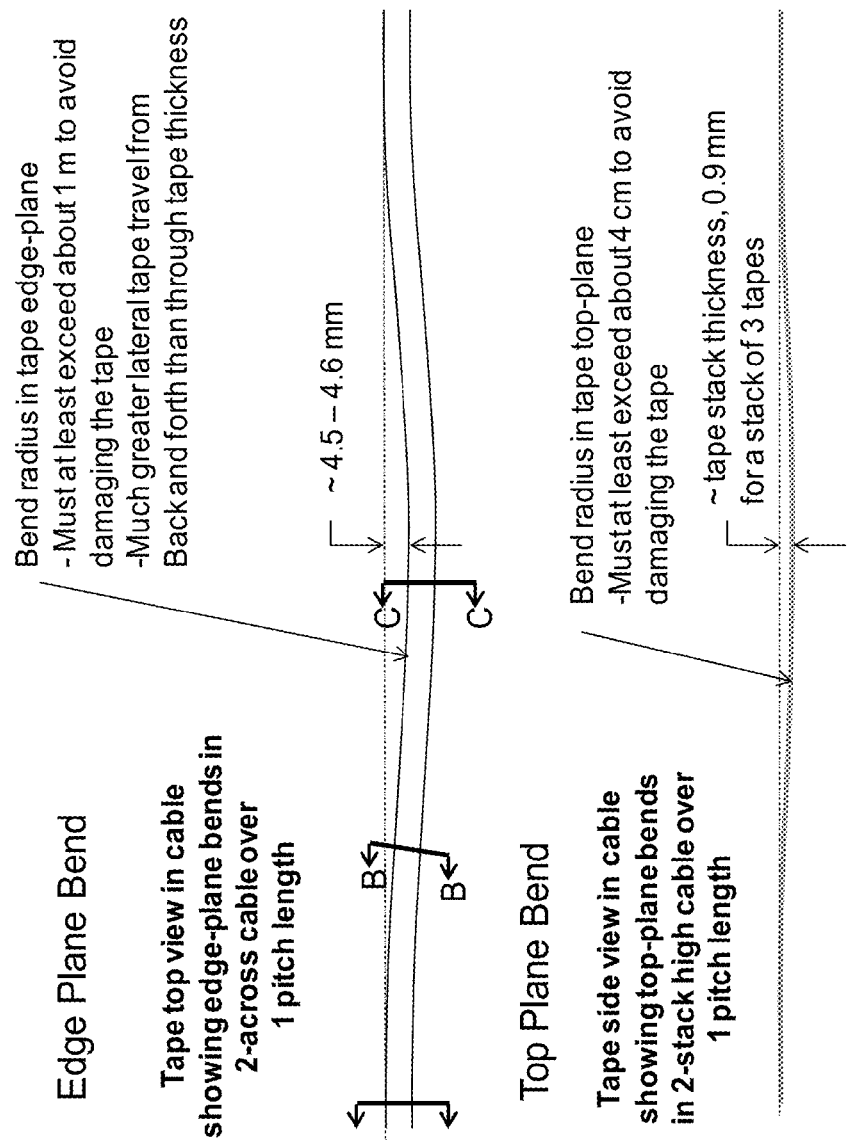
FIG. 12A illustrates cable and the challenges in making the edge bends.

FIG. 12 Illustration of the challenges in making the required edge bends (A), and keeping the tape stack in the plane of the cable as shown for sections A-A, B-B and C-C (B).

The strain of a bent tape is greatest near its surfaces and is approximated by equation 1, where t is tape dimension in the bend direction and d is bend diameter. For 2223 tapes, t for an edge bend is the width of the 2223 filament bundle in the tape, which, as seen in TABLE 1, is about 20 times greater than the thickness of the filament bundle and is about 90% of the tape width. If the 2223 exhibits a critical tensile strain limit of about 0.45 percent where Ic degradation starts to occur, then the minimum edge bend diameter for the tape is 90 cm, while it is only about 4 cm for a bend in the tape top plane. As a result, in order to attain reasonably short cabling pitches, the edge bends must assume the smoothest possible sinusoidal types of shapes.

Figure 12B:
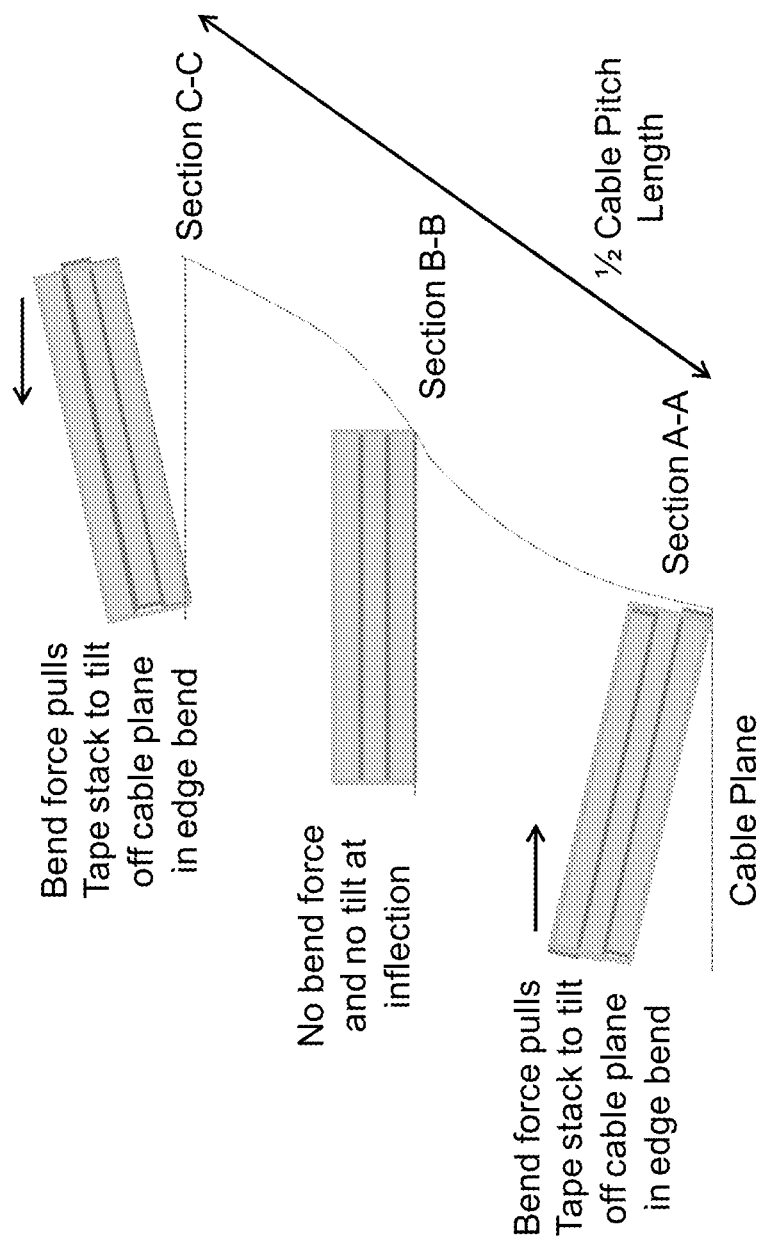
FIG. 12B illustrates the cable and challenges in keeping the tape stack in the plane of the cable as shown for sections A-A, B-B and C-C.

Attaining this type of S shape will be assisted as shown in FIG. 11(B) by attaching semi cylindrical edge guides to both edges of the stacked tapes that comprise each strand in the cable, in combination with layup tooling that directs the lateral position of each tape.

b) Making Dimensionally Uniform Cables:

As shown in FIG. 12(B), edge bending of high aspect tape or tape bundles can readily lead to tilting of the tape or tape bundles up or down from the cable plane, disrupting the geometry of the cable. In order to prevent pop up of the tape stacks due to edge bend strain effects in high aspect stacks, a very tight metal or polymer tape wrap will be applied as the cable exits the layup tooling, and two thin stiff metal tilt restraining strips may be included as shown if required to further inhibit tilt motion.

8.1.6 Cable Design Analysis

The inventor has developed a cable design analysis model. The analysis is applied here to demonstrate the trade-off between different cable components and build parameters and also to illustrate how cables with the target properties may be achieved.

HTS oxide materials are brittle even in the metal matrix composite form, with damage and irreversible Ic decrease observed when their critical strains are exceeded. The analysis applies an accounting of the strain budget up to the critical strain when applying strains to various parts of the 2223 in the tape by edge plane and top plane bending, as well as then bending the cable in winding the coil. If the sum of these strains does not reach the critical strain, then the remaining non damaging strain is available to accommodate Lorentz force induced hoop stress.

Strain Relief Mechanisms for Meeting Tight Bend Tolerance Requirements:

In the required planetary cabling sequence, the tape edge regions are pre-strained due to the edge bend, and through the tape thickness by the bend required to traverse from the build bottom to the top. When this cable is then bent, the axial tensile and compressive strains generated by the bend are added to these strains, and if the sum of all the strains exceeds the axial critical tensile or compressive strain of the 2223 oxide, its local Ic degrades. However, the amount of added axial strain from a certain amount of bend can be diminished by axial movement of the tape bundles, driven by the expansive axial force on the compressive side and the contractive force on the tensile side of the bend. If the cable is appropriately designed and built, the tapes can move locally along the cable axis, negating a part of the alternating axial tensile and compressive stresses on each tape and increasing bend tolerance. This mechanism is activated by low friction conditions between tape stacks and the edge guides illustrated in FIG. 11(B) and both methods are within the scope of this invention.

Number of Tapes Required in Specific Embodiments for 3, 5 and 10 kA Cables:

A cable's Ic must exceed its maximum Iop by margins that place an acceptably low risk that none of the tapes will exceed their Ic levels anywhere in the cable. Because the margins used can vary by quite lot, in this analysis, cable current was assessed all the way to the cable Ic, that was estimated as the sum of component tape Ic's.

From the data in FIG. 1, SEI 2223 tape at 4.2 K is likely to exhibit Ic of about 420 A in 30 T and about 470 A in 16 T. From these values, cables with 3, 5 and 10 kA Ic's at 4.2 K and 30 T cables will require 8, 12 and 24 tapes. Design analysis were then completed for a variety of cable configurations, with systematic introduction and assessment of features with the potential to improve cable properties like bend tolerance, and the amount of required conduit material for axial stress tolerance.

Design of a Model 8 Tape Cable that Supports Lorentz Force Stress with Minimum Added Material:

Bend and axial load tolerance calculations for a cable in operation with Lorentz force induced hoop stress at 16 T and 30 T were used to estimate the amount of conduit required with respect to cable wind diameter in the coil, as well as Iop, if it has the same modulus and yield stress as the tape reinforcement. Results for a model cable comprised of 8 tapes in a two tapes across by four tapes thick cable with 2 tapes per stack are presented in TABLE 3, below (in accord with FIG. 13 that illustrates an 8 tape model cable).

| Cable Design Analysis Example 1 | |
| --- | --- |
| Number of tapes total | 8 |
| Number of tapes/stack | 2 |
| Number of tapes across cable | 2 |
| Number of tapes through cable | 4 |
| Cable insert width | 10.8 mm |
| Cable insert thickness | 1.8 mm |
| Edge bend guides | Yes |
| Tilt restraint strips | 2 |
| Width | 10.1 mm |
| Thickness | 0.2 mm |
| Ic in 16 T | 3.8 kA |
| Ic in 30 T | 3.8 kA |
| Conduit, strip modulus | 260 GPa |

FIG. 13 illustrates an estimated conduit area needed for 2223 to remain below its critical strain at increasing coil turn diameters from the lower bend tolerance limit into the Lorentz force dominated regime for an 8 tape model cable. This design will be one of the types used to assess and develop features and process parameters required to produce transposed 2223 high current cables.

Cabling introduces residual strains into the 2223. These diminish the amount of additional strain that can be introduced by bending in coil winding and by Lorentz force induced stresses during use. In order to obtain and make as much of this additional strain as possible, strain reduction and homogenization features were applied in this analysis to reduce the amount of residual axial strain in each tape due to cable bending, as well as use of a strain-biased cabling technique. These in combination can greatly reduce the diameter to which the cable can be bent, and the amount of conduit required.

With this mechanism, the tape on the compressive side of the bend cable can slide axially around to the tensile side, thereby cancelling a portion of the tensile and compressive strains out, alleviating some fraction of both the axial tensile and compressive strains. This mechanism is enabled by introducing low coefficient of friction contact between the tapes, and in the case of 2212, the rectangular wires and their adjacent contacting materials in the cable. This coefficient of friction may be lowered by the addition of solid lubricants like thin graphite paper, low friction polymeric materials like PTFE, fine spherical powder that can act as fine ball bearings as well as by liquid lubricants like oils, that are present as very thin films during cabling and winding, and that turn solid upon cooling down of the cable to cryogenic temperatures. The oil or other liquid, including even a liquid metal, in this case serves the purpose also of mechanically binding together the cable at operating conditions where it is solid, thereby improving the cable's resistance to mechanical and electrical failure.

The results illustrate an optimum in the 20 cm to 30 cm bend diameter range that requires a minimum of conduit between bend and Lorentz force dominated strain regimes that require more conduit. The target bend tolerance for the 10 kA (30 T) cable is also in the 20 cm to 30 cm bend diameter range, although smaller diameter limits are always good. However, the 16 T magnet at the NHMFL for coiled cable testing has a 16.8 cm bore. In order to be able to complete Lorentz force testing of coiled cables for demonstrating feasibility, analysis is completed for development at 16.5 cm bend diameter also even though such small diameter bend tolerance is difficult to attain with a high current HTS cable. The 2223 cable with 4 tapes through its thickness allows bending to 16.5 cm diameter, as low as 14 cm, without damage.

Figure 14A:
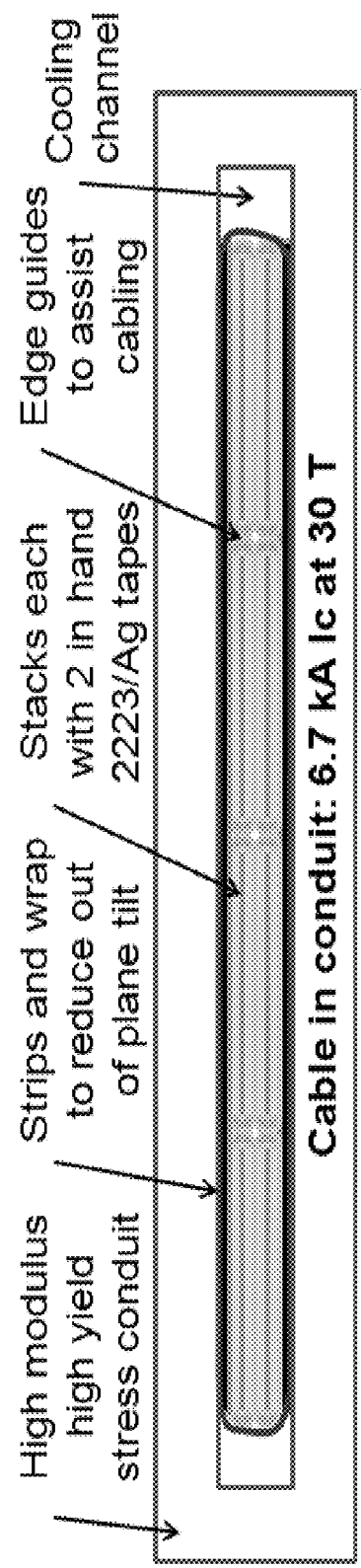
FIG. 14(A) illustrates a 4 tape thick, by 2, 3, 4 or 5 tape wide 2223 transposed cable in a high strength conduit.

Further Examples of 2223 and 2212 Transposed Cables:

FIG. 14: Properties, as an example are quoted here at 4.2 K, but apply at higher operating temperatures as well. (Iop—operating current, Jop—operating current density, Bop—operating magnetic field that impinges on the cable). This type of cable can be bend to as small as 14 cm in diameter. Targets are shown in TABLE 4 (in accord with FIG. 14A).

| Targets | Progress to higher wind currents in higher fields (tame iL × B |
|---|---|
| I op | 3 kA, 5 kA, 10 Ka |
| B op | 16 T, 30 T, 45 T |
| Bend diameter coiled at Iop | 15 cm, 25 cm, greater than 35 cm |
| Ramped field loss | TBD, opportunity for low loss 2212 |
| Jop of cable in conduit | 50 A/mm2 or better |

FIG. 14(A) Illustration of a typical 4 tape thick, by 2, 3, 4 or 5 tape wide 2223 transposed cable in a high strength conduit. The tapes may be cabled as stacks of two, making for example 2×2, 2×3, 2×4, 2×5 and 2×6 Roebel cable with 4, 6, 8, 10, 12 stacks each, and 8, 12, 16, 20 and 24 2223/Ag tapes. They may also be cabled individually.

Figure 14B:
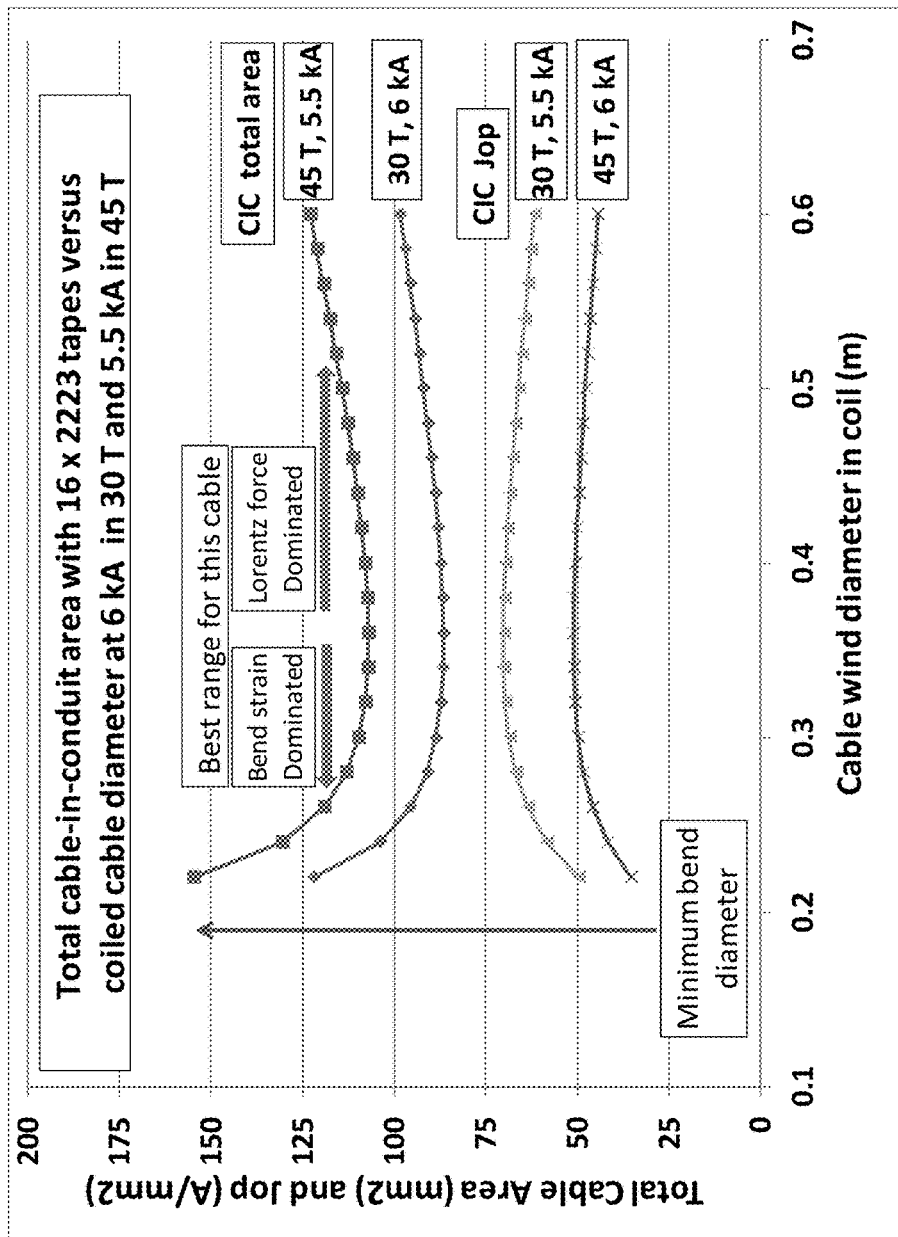
FIG. 14 (B) illustrates cable design details and total cable area (C) including the added reinforcement, in the form of for example on or more conduits, channels, tubes, strips or more complex shaped members.

TABLE 5, below illustrates data of 16 total tapes in accord with FIG. 14B.

| | |
|---|---|
| Number of tapes total | 16 |
| 2223' Ag tape width | 4.2 mm |
| 2223/Ag tape thickness | 0.22 mm |
| Reinf strip thickness × 2 | 0.06 mm |
| Number of tapes per stack | 2 |
| Number of tapes across cable | 4 |
| Number of tapes through cable | 4 |
| Cable insert width | 20 mm |
| Cable insert thickness | 1.4 mm |
| End bend guides | Yes |
| Tilt restraint strips | Yes |
| Width | 21 mm |
| Thickness | 0.2 mm |
| Ic in 30 T | 6.8 kA |
| Ic in 45 T | 6.1 kA |
| Coil minimum diameter | 200 mm |
| Conduit, strip modulus | 260 GPa |
| He Cooling Channel | 30% |

FIG. 14 (B) Illustration of cable design details and total cable area (C) including the added reinforcement, in the form of for example on or more conduits, channels, tubes, strips or more complex shaped members. This cable can be bent to an 18 cm diameter minimum.

TABLE 6, below, outlines 4 tape thick 2223-based and 2 wire thick 2212 based transposed cable examples

| BSCCO cable candidate designs identified by this analysis | | | | | | |
|---|---|---|---|---|---|---|
| 45 T | 2223 Cable Designs | | Zero load min bend | Analysis bend | CIC Total | Cable Ic |
| #/stack | # across | # tapes | diameter (cm) | diameter (cm) | Area mm2 | Je A/mm2 | at 45 T (kA) |
| | | | 2223/Ag: 4.2 mm × 0.22 mm, +33% reinf. | | | |
| 2 | 2 | 8 | 14.4 | 22 | 54 | 57 | 3 |
| 2 | 3 | 12 | 16.2 | 24 | 89 | 51 | 4.5 |
| 2 | 4 | 16 | 17.8 | 27 | 126 | 48 | 6 |
| 2 | 5 | 20 | 19.2 | 29 | 167 | 46 | 7.5 |
| | | | 2212/Ag: 1.2 mm × 0.6 mm, +33% reinf | | | |
| 1 | 6 | 12 | 12.4 | 18 | 53 | 56 | 3.3 |
| 1 | 11 | 22 | 18.5 | 27 | 123 | 44 | 6 |
| 1 | 14 | 28 | 21 | 32 | 166 | 42 | 7.7 |
| 1 | 17 | 34 | 22.9 | 34 | 218 | 39 | 9.3 |
| React and wind approach: 2212 rectangular wire, 2223 tape | | | | | | | |

Part 3 Conduits for HTS Cables

Figure 15:
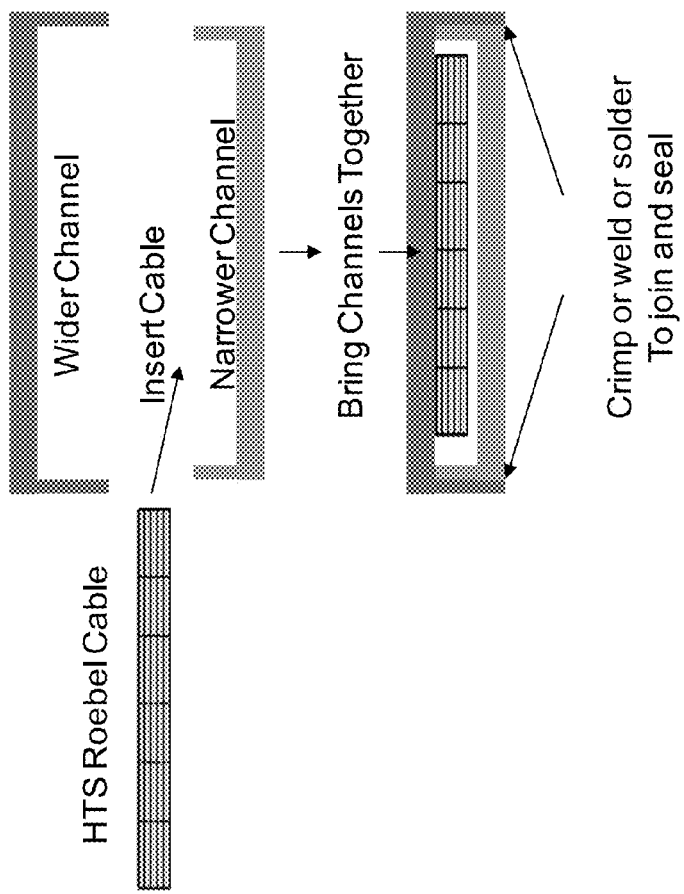
FIG. 15 illustrates a low cost, easy to assemble conduit for HTS transposed high current cable.

The schematic diagram in FIG. 15 illustrates a low cost, easy to assemble design and method for putting and sealing long HTS cables into high strength, high modulus conduits. Two channels are obtained fit together as shown. The cable is easily inserted into the narrower channel, and the wider channel is lowered onto the narrower channels as shown. The channels are then bonder together and sealed using crimping, welding, soldering or possibly even with an organic adhesive. Example conduit material that works for specific embodiments if it exhibits a modulus in excess of 190 GPa and yield strain in excess of about 0.6%.

FIG. 15 Low cost, easy to assemble conduit for HTS transposed high current cable.

Specific embodiments herein include the 2212 multifilament superconducting rectangular wire wherein the wire cross-sectional area is from about 0.3 mm$^2$ to about 1.5 mm$^2$. The area can be from about 0.08 mm$^2$ to about 1 mm$^2$, or from about 0.3 mm$^2$ to about 0.8 mm$^2$. The 2212 multifilament superconducting rectangular wire can have a wire stress tolerance of greater than about 300 MPa. The wire can have an axial tensile stress tolerance of greater than 0.4 percent. The wire can have the reinforcement strips, and the reinforcement strips can be sintered to the wire via a heat treatment. The reinforcement strips can have a width from about 0.5 mm to about 2 mm, or about 0.5 mm to about 1.5 mm, or from about 0.5 mm to about 1 mm. The reinforcement strips can have a thickness of about 0.020 mm to about 2 mm, or from about 0.02 mm to about 1 mm, or from about 0.20 to about 0.8 mm.

Specific embodiments herein include the 2223 silver tape-based cable wherein the edge guides are each semi-cylindrical in shape and are configured to maintain a radius edge bend. The 2223 silver tape-based cable can have a conduit that has a cooling channel. The 2223 silver tape-based cable can be configured such that each of the tape stacks comprise 2 tapes in each of the stacks. The tapes can be constructed so as to have a tensile load tolerance of about 540 MPa at 77 K. The 2223 silver tape-based cable of can have a polymer tape wrap encasing the stacks. The 2223 silver tape-based cable can have tilt restraining strips located between the polymer wrap tape and the tape stacks, and the tilt restraining strips can be located on opposing sides of the tape stacks. The reinforcement strips can be each solder laminated onto the tapes. The tape stacks can comprise from 2 to 4 tapes in each stack. The cable can comprises a total of 8 tape stacks oriented such that the thickness is 2 tape stacks and a width is 4 tape stacks. The cable can comprises a total of 16 tape stacks, oriented such that the thickness 4 tape stacks and the width is 4 tape stacks. The conduit can comprise two sections of differing channel sizes and lengths such that one of the sections can slide over the other section and be sealed together forming two two-layered walls opposing each other. Specific embodiments of tapes or wires herein can include from about 1 to 2, about 1 to 4, or about 1 to 10 reinforcement strips, covering about up to 90 percent of the wire outer surface area, or about 25 percent to about 50 percent, or from about 50 percent to about 90 percent. In specific embodiments the end product includes a mix of reinforcement strips. Reinforcement strips can formed of one piece or many, and can be in the form of a wire (FIG. 17B) with one or more filaments, or a mix thereof.

Figure 16A:
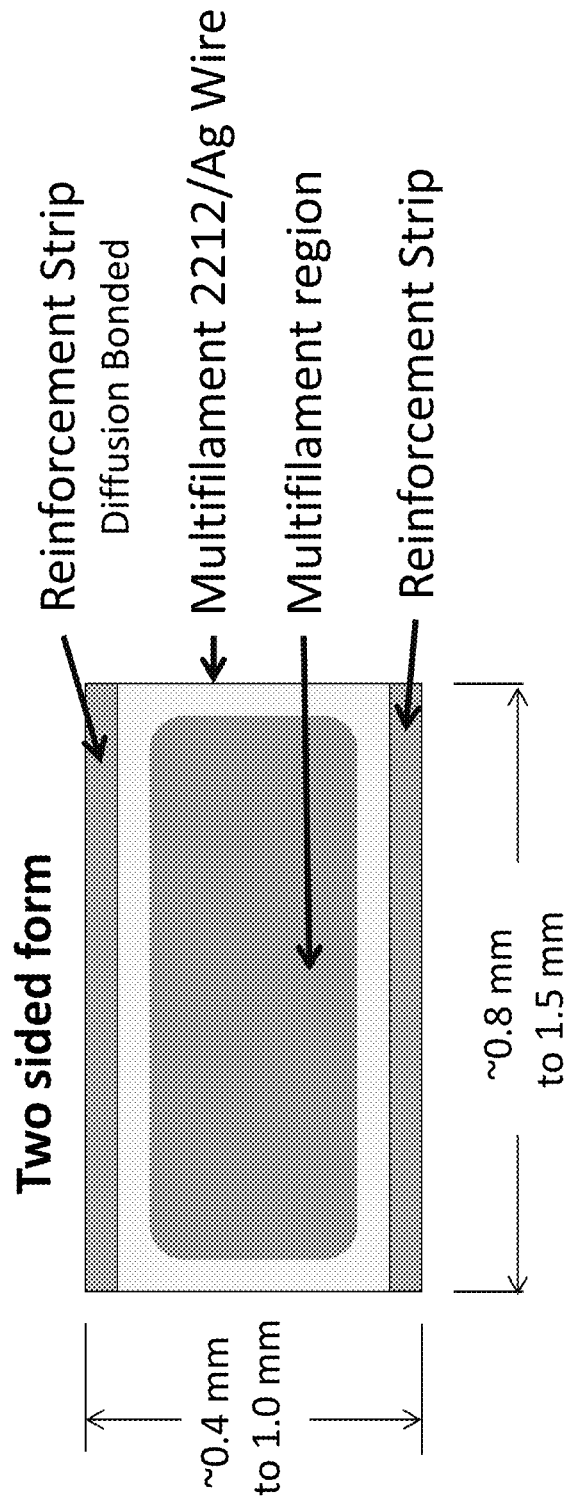
FIG. 16A illustrates a two-sided reinforcement embodiment as described herein.
Figures 16B, 16C:
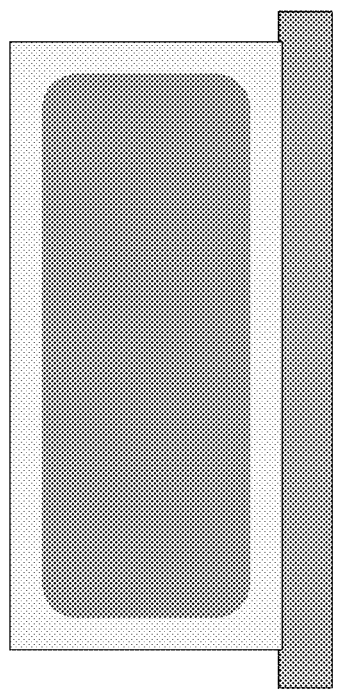
FIG. 16 B illustrates a single-sided reinforcement embodiments as described herein.
Figure 18:
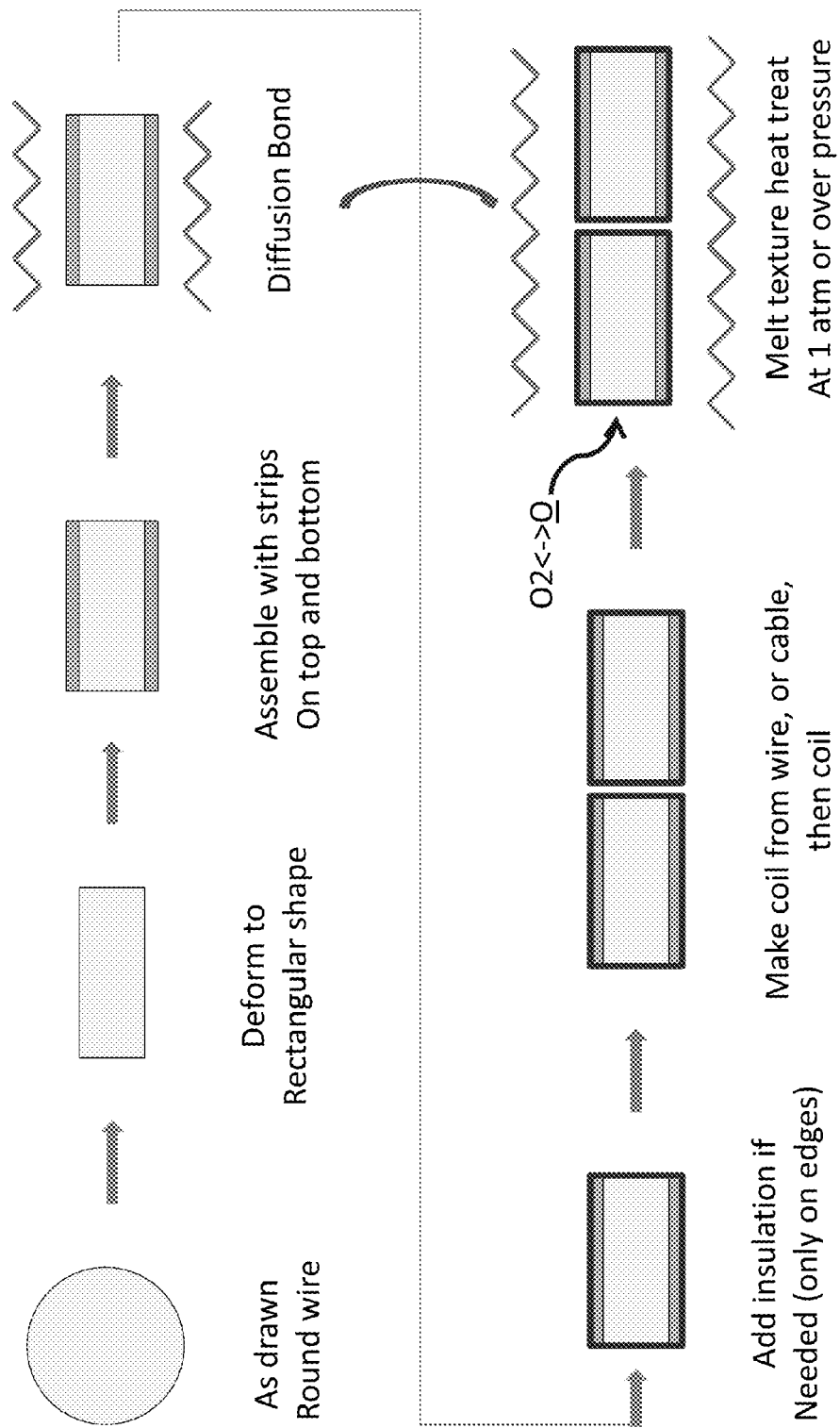
FIG. 18 illustrates a flexible, practical, low-cost approach for making strong 2212 wire as described herein.

Specific embodiments can comprise reinforced wires or tapes as described herein, at 50 meter lengths or greater and with greater than about 400 MPa tensile stress tolerance. Embodiments can include shapes ranging in specific examples from square to a 3:1 aspect. TABLE 7 below shows specific example embodiments of reinforcements upon two sides as in FIG. 16A and attributes of specific embodiments.

TABLE 7

| Shapes | Rectangular, Square, Round |
|---|---|
| Lengths | Greater than 50 meters |
| Wire Current Density | Greater than 500 A/mm$^2$ (5T, 4.2 K), another example at greater than 350 A/mm$^2$ (5T, 4.2 K) |
| Tensile Stress | About 250 to greater than 400 MPa, with less than 25% or 35% strip coverage |
| Coil Fab. Bend Diameters | About 2 to about 20 cm before melt texturing "reaction" in the W&R coil fabrication mode (in one or both directions) where W&R denotes Wind and React. |

Example reinforcement strips that can be used as described are shown in TABLE 8, below:

TABLE 8

| Item | Width | Thickness |
|---|---|---|
| Strips | 0.8 mm | 0.1 mm |
|  | 0.9 mm | 0.1 mm |
|  | 1.0 mm | 0.05 mm |

Figure 19:
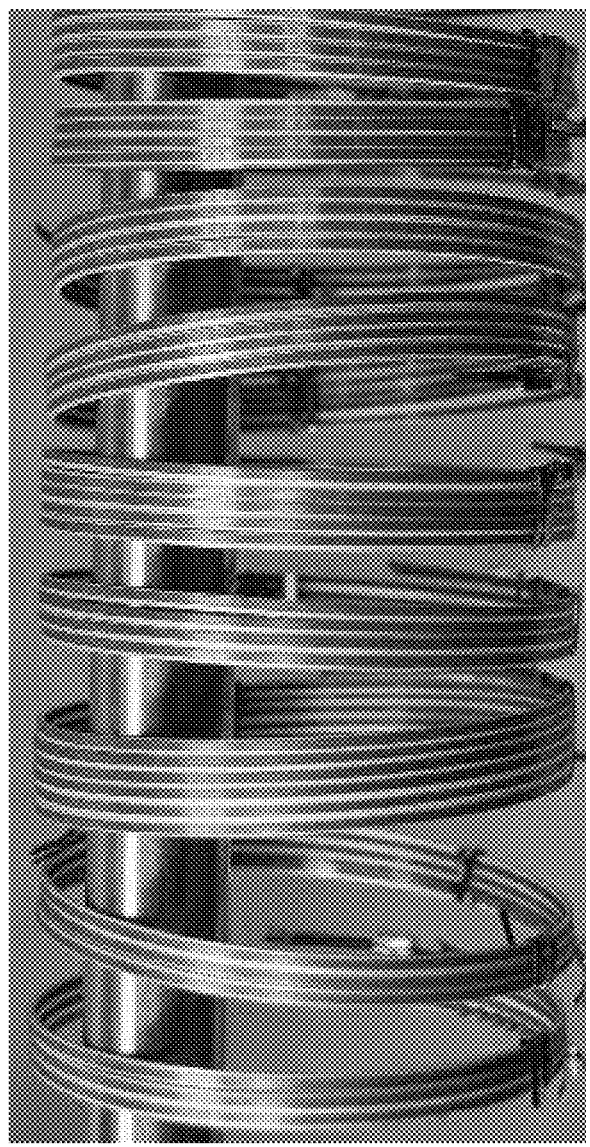
FIG. 19 illustrates a mandrel assembled and bonded structure as described herein.

FIG. 19 illustrates mandrel assembled and bonded samples. Example embodiments can include 47 mm diameter by about 0.9 m wires, 40 mm and 73 mm diameter by 1.2 m wires, and/or 47 mm diameter×2 m wire. Embodiments can include about 45 to about 55 mm diameter by about 0.5 to about 1 m wires.

In specific embodiments the reinforced 2212 multifilament round wire, rectangular wire, cable with the 2212 multifilament round wire, the tapes, and/or reinforced 2223 silver tape-based cable can have a metal core. The core can comprise a metal or metals that an oxide can form thereon. In specific embodiments the metal core can be iron, aluminum, chrome, cobalt, or combinations of 2, 3, or all 4 of these. In specific embodiments the oxide formed thereon is aluminum oxide, nickel oxide, and/or chromium oxide; there can be 1, 2, 3, 4, 5, 6, 7, 8, 9, or 10 layers, or from about 2 to about 5 layers, or from about 5 to about ten layers. In specific embodiments the oxide layer or layers is formed on an outer surface of the metal core, or an inner surface or the metal core, or both; an example outer and inner surface of a reinforcement strip embodiment are each indicated in FIG. 17B. In FIG. 17A, 100 shows a surface where the oxide can be formed; it can be partially or completely around one, some, or all of the reinforcement strips (such as about 25-50 percent around or from about 50-100 percent around the surface or surfaces), in any reinforcement strip form, such as the reinforcement strip shown as the wire in FIG. 17A.

The invention claimed is:

1. A reinforced 2212 multifilament round wire comprising:
   the 2122 multifilament superconducting round wire;
   at least two reinforcement strips each comprising a metal core comprising on an outer surface of the metal core at least one of aluminum oxide, nickel oxide, and chromium oxide;
   the at least two reinforcement strips are coupled to the outside of the 2212 multifilament round wire; and
   the at least two reinforcement strips are arranged with a space therebetween.

2. The reinforced 2212 multifilament round wire of claim 1, wherein the coupling of the at least two reinforcement strips is via a helical spiral arrangement onto the surface and along the length of the 2212 multifilament round wire.

3. A reinforced 2212 multifilament rectangular wire comprising:
   the 2122 multifilament superconducting rectangular wire;
   at least one reinforcement strip comprising a metal core comprising on an outer surface of the metal core at least one of aluminum oxide, nickel oxide, and chromium oxide;
   the at least one reinforcement strip is coupled to the outside of the 2212 multifilament rectangular wire; and
   the wire axial stress tolerance is greater than 300 MPa.

4. The reinforced 2212 multifilament superconducting rectangular wire of claim 3, wherein the wire cross-sectional area is from about 0.3 mm2 to about 1.5 mm2.

5. The reinforced 2212 multifilament superconducting rectangular wire of claim 3, wherein the wire has an axial tensile strain tolerance of greater than 0.4 percent.

6. The reinforced 2212 multifilament superconducting rectangular wire of claim 3, wherein the at least one reinforcement strip is sintered or diffusion bonded to the 2212 multifilament superconducting rectangular wire via a heat treatment.

7. The reinforced 2212 multifilament superconducting rectangular wire of claim 3, wherein the at least one reinforcement strip has a width from about 0.2 mm to about 2 mm, and a thickness of about 0.02 mm to about 2 mm.

8. A cable comprising reinforced 2212 multifilament superconducting rectangular wire comprising:
at least four of the 2212 multifilament superconducting rectangular wires; at least one reinforcement strip comprising a metal core comprising on an outer surface of the metal core at least one of aluminum oxide, nickel oxide, and chromium oxide;
the at least one reinforcement strip is coupled to the outside of one of the 2212 multifilament superconducting rectangular wires; and
the at least one reinforcement strip has a width from about 0.2 mm to about 2 mm, and a thickness of about 0.02 mm to about 2 mm.

9. The cable of claim 8 wherein the at least one reinforcement strip comprises at least four reinforcement strips, with each of the reinforcement strips coupled to one of the corresponding 2212 multifilament superconducting rectangular wires.

10. A reinforced 2223 silver tape-based cable comprising:
two or more 2223 silver tape stacks comprising at least two tapes in each tape stack;
at least one reinforcement strip coupled, respectively, to each of the at least two tapes;
the at least one reinforcement strip comprising a metal core comprising on an outer surface of the metal core at least one of aluminum oxide, nickel oxide, and chromium oxide; and
opposing edge guides;
each edge guide coupled to an edge of at least one of the two tape stacks; and a conduit housing the 2223 silver tape-based cable.

11. The reinforced 2223 silver tape-based cable of claim 10 wherein the edge guides are each semi-cylindrical in shape and are configured to maintain a radius edge bend.

12. The reinforced 2223 silver tape-based cable of claim 10 wherein the conduit has a cooling channel.

13. The reinforced 2223 silver tape-based cable of claim 10 wherein each of the tape stacks comprise 2 tapes.

14. The reinforced 2223 silver tape-based cable of claim 10 wherein each of the tapes are constructed so as to have a tensile load tolerance of at least about 400 MPa at 77 K.

15. The reinforced 2223 silver tape-based cable of claim 10 wherein a polymer tape wrap encases the stacks.

16. The reinforced 2223 silver tape-based cable of claim 15 wherein tilt restraining strips are located between the polymer wrap tape and the tape stacks, the tilt restraining strips located on opposing sides of the tape stacks.

17. The reinforced 2223 silver tape-based cable of claim 10 wherein each of the reinforcement strips are solder laminated onto the tapes.

18. The reinforced 2223 silver tape-based cable of claim 10 wherein the tape stacks comprise from 2 to 4 tapes in each stack.

19. The reinforced 2223 silver tape-based cable of claim 10 wherein the cable comprises a total of 8 tape stacks oriented in an arrangement of 2 of the tape stacks by 4 of the tape stacks.

20. The 2223 silver tape-based cable of claim 10 wherein the cable comprises a total of 16 tape stacks oriented in an arrangement of 4 of the tape stacks by 4 of the tape stacks.

21. The 2223 silver tape-based cable of claim 10 wherein the conduit comprises two sections of differing channel sizes and lengths such that one of the sections can slide over the other section and be sealed together forming two two-layered walls opposing each other.

* * * * *